(12) United States Patent
Sanchez-Olea et al.

(10) Patent No.: US 7,850,083 B2
(45) Date of Patent: Dec. 14, 2010

(54) DIGITAL CONTROL SYSTEM FOR AN ELECTRO-OPTICAL DEVICE

(76) Inventors: Jorge Sanchez-Olea, 15655 Oakstand Rd., Poway, CA (US) 92064; Alicia Sanchez, 15655 Oakstand Rd., Poway, CA (US) 92064

(*) Notice: Subject to any disclaimer, the term of this patent is extended or adjusted under 35 U.S.C. 154(b) by 1111 days.

(21) Appl. No.: 11/537,504

(22) Filed: Sep. 29, 2006

(65) Prior Publication Data

US 2007/0030176 A1     Feb. 8, 2007

Related U.S. Application Data

(63) Continuation-in-part of application No. 11/397,651, filed on Apr. 4, 2006, now Pat. No. 7,185,815, and a continuation-in-part of application No. 10/512,931, filed on Oct. 29, 2004, now Pat. No. 7,154,924, which is a continuation-in-part of application No. 10/679,553, filed on Oct. 6, 2003, now abandoned, application No. 11/537,504, which is a continuation-in-part of application No. 10/513,105, filed on Oct. 29, 2004, now abandoned.

(60) Provisional application No. 60/457,095, filed on Mar. 24, 2003.

(51) Int. Cl.
    *G06K 7/14* (2006.01)

(52) U.S. Cl. .................... 235/454; 235/455
(58) Field of Classification Search ................ 235/454, 235/455; 250/236
    See application file for complete search history.

(56) References Cited

U.S. PATENT DOCUMENTS

| 7,381,935 B2 * | 6/2008 | Sada et al. ............ 250/205 |
| 7,421,308 B2 * | 9/2008 | Nussbaum et al. ...... 700/186 |
| 7,608,806 B2 * | 10/2009 | Draper et al. ......... 250/205 |
| 2007/0069155 A1 * | 3/2007 | Mirro et al. ......... 250/491.1 |

* cited by examiner

*Primary Examiner*—Ahshik Kim
(74) *Attorney, Agent, or Firm*—Schwabe, Williamson & Wyatt, P.C.

(57) ABSTRACT

A method and firmware for digitally controlling an electro-optical device include steps of receiving as input a first analog signal representative of a measured parameter from an electro-optical device generated by the electro-optical device in response to a second analog signal representative of a set parameter received by the electro-optical device, digitizing the first analog signal to generate a digital feedback value, subtracting the digital feedback value from a digital set point value to calculate a digital error value, calculating a digital cumulative error sum from the digital error value, calculating a digital control value as a function of the cumulative error sum, converting the digital control value to the second analog signal, and driving the electro-optical device toward the digital set point value with the second analog signal.

38 Claims, 13 Drawing Sheets

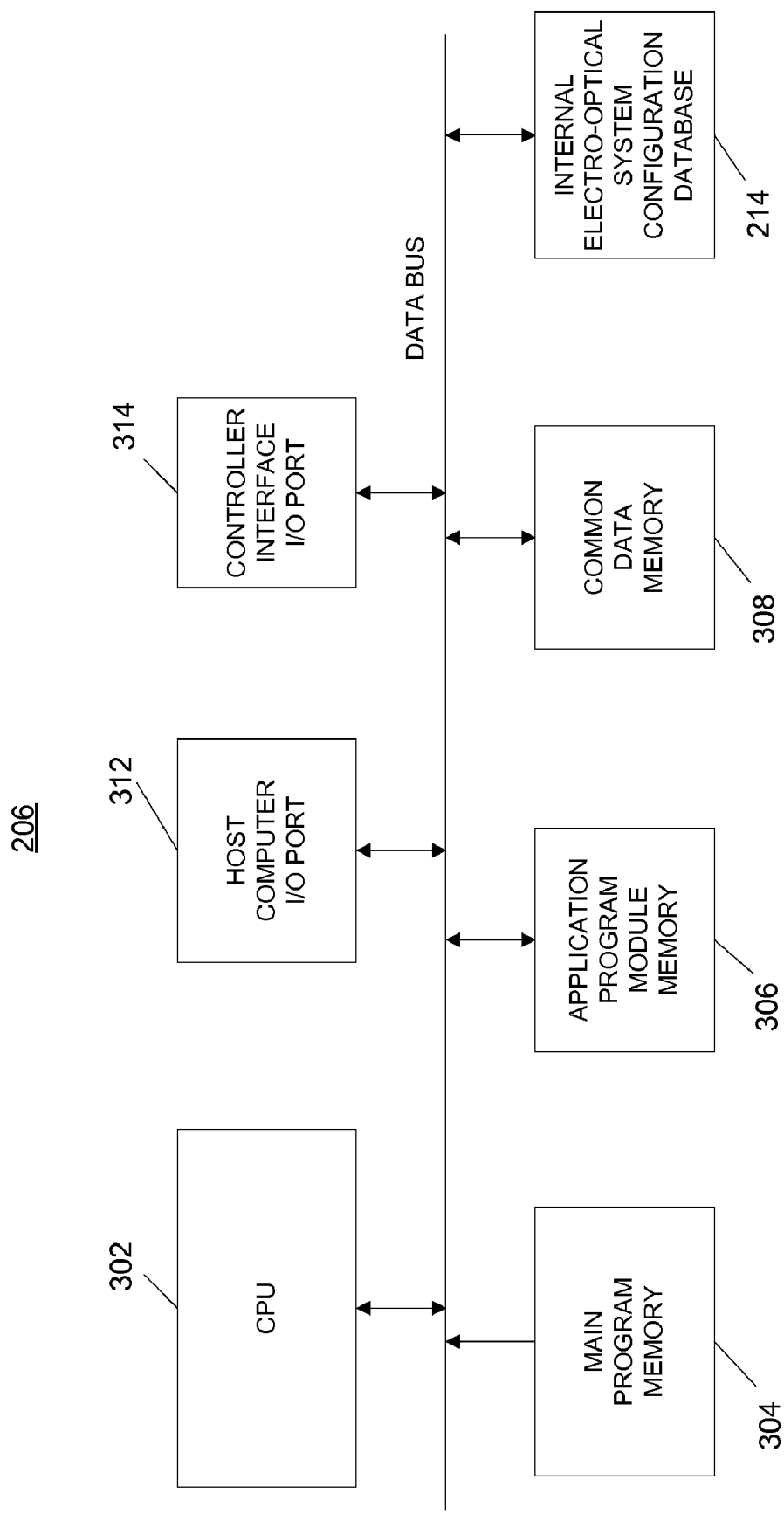

DIGITAL CONTROL SYSTEM FOR AN ELECTRO-OPTICAL DEVICE

CROSS-REFERENCE TO RELATED APPLICATIONS

This application is a continuation-in-part of U.S. patent application Ser. No. 10/512,931, filed Oct. 29, 2004 now U.S. Pat. No. 7,154,924 and U.S. patent application Ser. No. 11/397,651, filed Apr. 4, 2006 now U.S. Pat. No. 7,185,815, which is a continuation-in-part of abandoned U.S. patent application Ser. No. 10/679,553, filed Oct. 6, 2003, which claims the benefit of Provisional Application No. 60/457,095, filed Mar. 24, 2003. This application claims the benefit of Provisional Application No. 60/457,095, filed Mar. 24, 2003. Each of the above applications is incorporated herein by reference. This application is also a continuation-in-part of U.S. patent application Ser. No 10/513,105, filed on Oct. 29, 2004 now abandoned which claims priority to U.S. patent application Ser. No. 09/724,692, now U.S. Pat. No. 6,629, 6388B1 filed on Nov 28, 2000.

BACKGROUND OF THE INVENTION

1. Field of the Invention

The present invention is directed to the operation and control of electro-optical devices such as lasers and laser diodes. More specifically, but without limitation thereto, the present invention is directed to a method and firmware for an electro-optical device.

2. Description of Related Art

Many different types of electro-optical devices are used in a variety of applications, for example, in optical transceivers used for fiber-optic communications systems. Each electro-optical device application typically includes a drive current source to drive the electro-optical device and a light output monitor to measure the optical power output of the electro-optical device. Depending on the type of electro-optical device, a device controller may measure and set several parameters to control the electro-optical device. An example of a measured parameter is optical output power. In an optical transceiver, lasers are utilized to transmit high speed information. An example of a set parameter is optical modulation amplitude (OMA) digital set point value. The set parameters are typically hard-coded in firmware or determined by hardware components in the controller. For example, the user may change components or modify software to adjust the optical modulation amplitude or the extinction ratio (ER) of a laser until a desired set point is measured.

SUMMARY OF THE INVENTION

In one embodiment, a method of digitally controlling an electro-optical device includes the following steps:
 (a) receiving as input a first analog signal representative of a measured parameter from an electro-optical device generated by the electro-optical device in response to a second analog signal representative of a set parameter received by the electro-optical device;
 (b) digitizing the first analog signal to generate a digital feedback value;
 (c) subtracting the digital feedback value from a digital set point value to calculate a digital error value;
 (d) calculating a digital cumulative error sum from the digital error value;
 (e) calculating a digital control value as a function of the cumulative error sum;
 (f) converting the digital control value to the second analog signal; and
 (g) driving the electro-optical device toward the digital set point value with the second analog signal.

In another embodiment, a computer readable storage medium tangibly embodying instructions that when executed by a computer implement a method for digitally controlling an electro-optical device includes steps of:
 (a) receiving as input a first analog signal representative of a measured parameter from an electro-optical device generated by the electro-optical device in response to a second analog signal representative of a set parameter received by the electro-optical device;
 (b) digitizing the first analog signal to generate a digital feedback value;
 (c) subtracting the digital feedback value from a digital set point value to calculate a digital error value;
 (d) calculating a digital cumulative error sum from the digital error value;
 (e) calculating a digital control value as a function of the cumulative error sum;
 (f) converting the digital control value to the second analog signal; and
 (g) driving the electro-optical device toward the digital set point value with the second analog signal.

The term "firmware" is used interchangeably herein with the phrase "computer readable storage medium tangibly embodying instructions that when executed by a computer implement a method".

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIG. 3 illustrates a detailed block diagram of the microcontroller of FIG. 2;

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

An electro-optical system may be, for example, a laser transceiver including one or more lasers and one or more photodiodes. The lasers may be tunable over a range of wavelengths. The electro-optical system may also include digital logic and analog integrated circuits such as high-speed drivers and signal conditioners. Other integrated circuits may be used to format and analyze data and to perform functions such as fiber-optic link tests and bit error rate (BER) measurement of an optical transmission link. Other examples of electro-optical system include cold-cathode fluorescent lamps (CCFLs) widely used as backlights for liquid crystal displays (LCDs), laser diodes, and light-emitting diodes (LEDs).

An electro-optical system is typically modulated by a digital signal having a logic low state and a logic high state. The optical output power of the electro-optical system is preferably maintained at an optical output power $P_{LOW}$ in the logic low state and an optical output power $P_{HIGH}$ in the logic high state by controlling the bias current and the modulation current of the electro-optical system. In a typical electro-optical system, the bias current and the modulation current are set and adjusted manually to compensate for changes in operating conditions such as temperature and aging of the laser.

Figure 1:
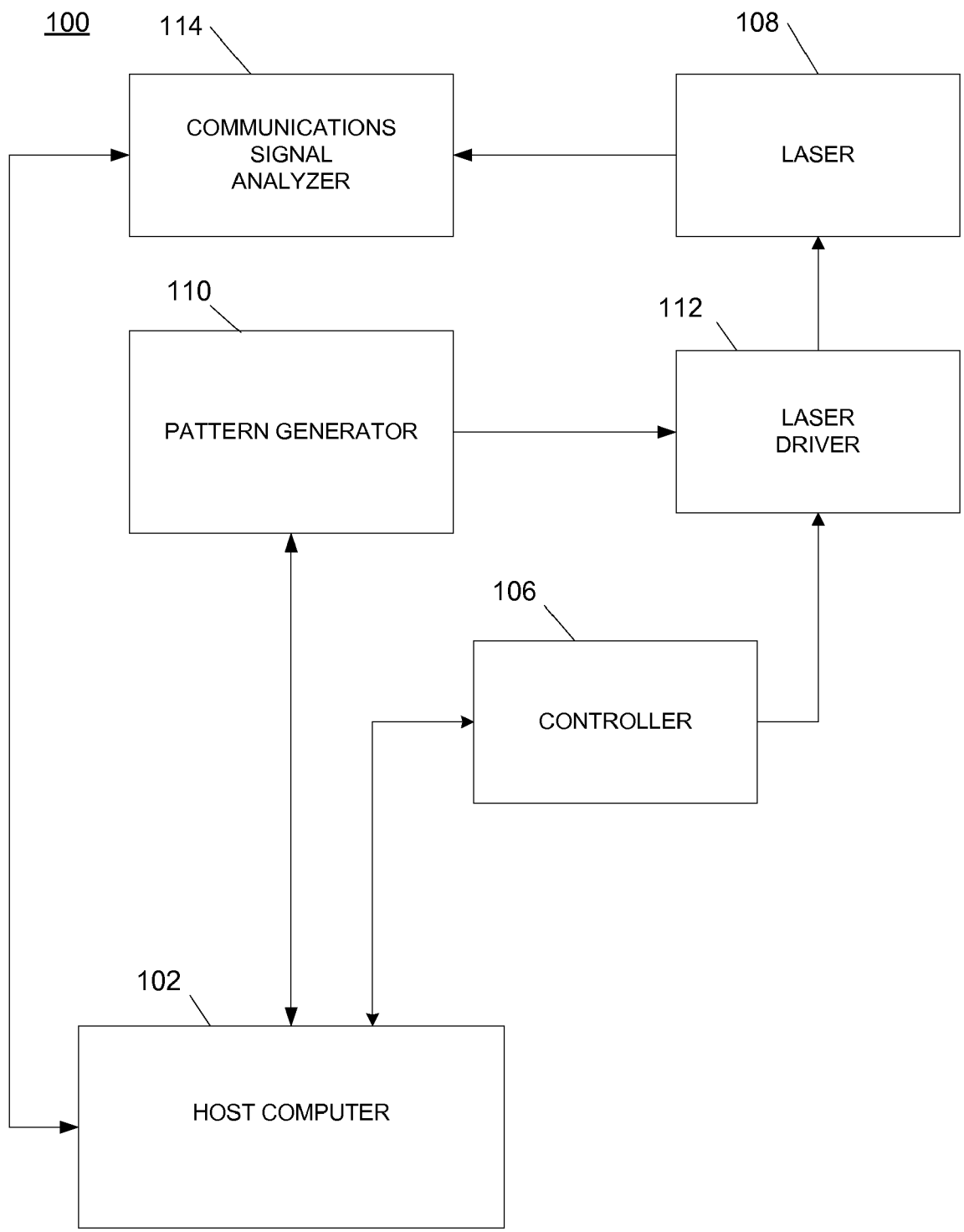
FIG. 1 illustrates a block diagram of a controller in a typical configuration for calibrating a laser according to the prior art.

FIG. 1 illustrates a block diagram 100 of a controller in a typical configuration for calibrating a laser according to the prior art. Shown in FIG. 1 are a host computer 102, a controller 106, a laser 108, a pattern generator 110, a laser driver 112, and a communications signal analyzer 114.

In FIG. 1, a user enters calibration parameters for the laser 108 into the host computer 102. The laser driver 112 receives a logic signal from the pattern generator 110 for modulating the laser 108 with a corresponding drive current. The controller 106 sets the bias current and the modulation current at the laser driver 112 and measures the optical output power and the operating temperature of the laser 108. The communications signal analyzer 114 measures the response of the laser 108 to the logic signal from the pattern generator 110. In one method, a table is generated by a user who changes the laser drive current at the laser driver 112, for example, via the host computer 102. As the temperature of the laser 108 is varied during calibration, the user enters adjustments to the bias current and the modulation current to maintain the optical output power at the desired values for $P_{LOW}$ and $P_{HIGH}$. A table of the bias current and the modulation current values as a function of temperature is stored in the controller 106.

A disadvantage of the arrangement of FIG. 1 is that the calibration program in the controller 106 generally has to be redesigned, re-programmed, and rebuilt for each type of laser and even more so for each different type of electro-optical device, resulting in costly project delays and prolonged turnaround time to market.

Another disadvantage is that the user has to manually enter adjustments to the bias current and the modulation current to maintain stable values of the optical output power levels $P_{LOW}$ and $P_{HIGH}$, which may distract the user from the task of calibrating the laser 108.

A further disadvantage of the arrangement of FIG. 1 is that the values of the bias current and the modulation current are predetermined and are not compensated for aging of the laser 108. As a result, the desired set points for the optical output power levels for $P_{LOW}$ and $P_{HIGH}$ may not be achieved using the table stored in the controller 106.

The disadvantages of the controller 106 in FIG. 1 described above may be avoided by a reconfigurable controller that can adapt to a wide variety of electro-optical devices without requiring a new controller design for each different electro-optical device. Also, the reconfigurable controller may include an expert agent for automatically maintaining stable values of the optical output power levels $P_{LOW}$ and $P_{HIGH}$ as described below.

Figure 2:
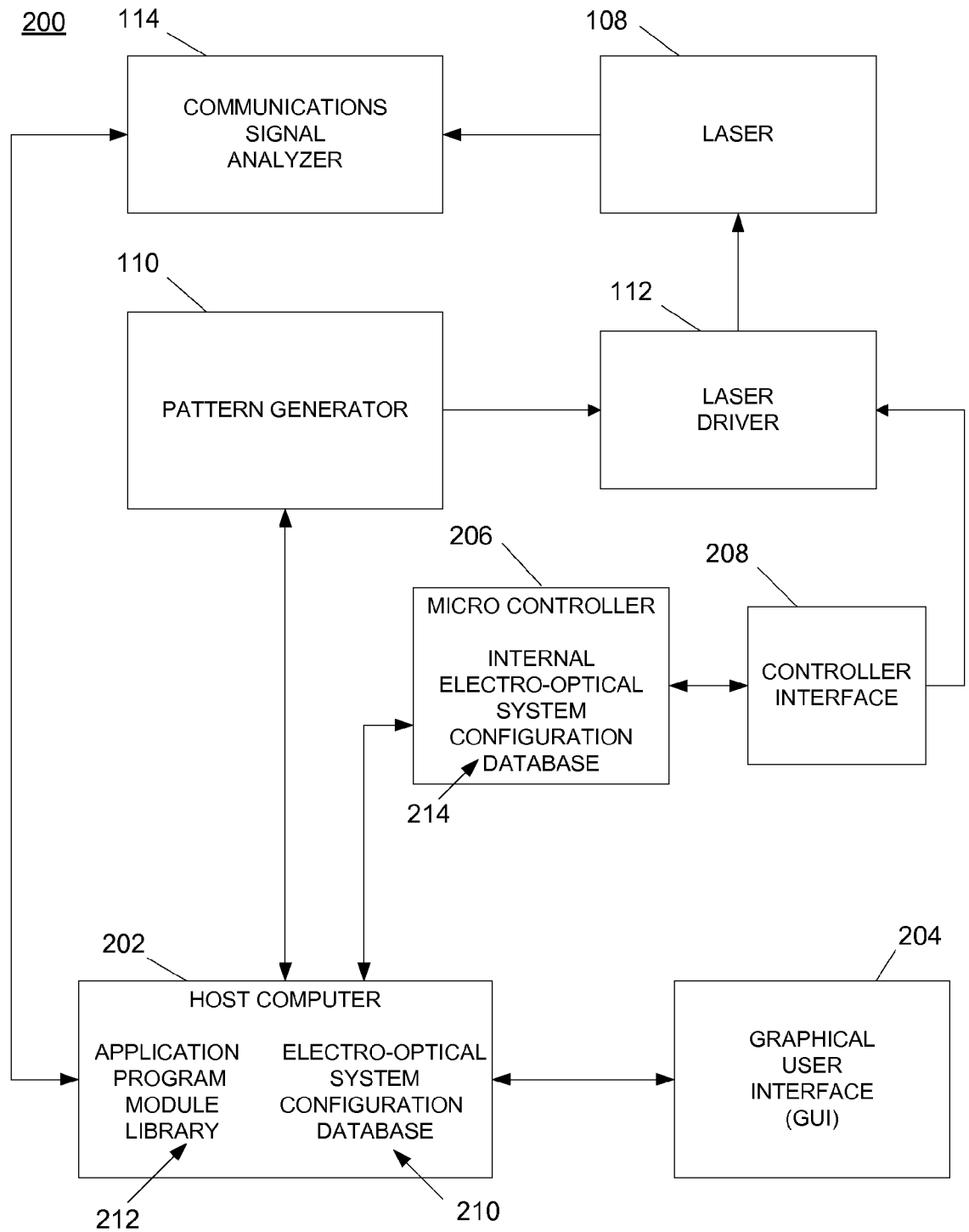
FIG. 2 illustrates a block diagram of a microcontroller in a configuration for digitally controlling an electro-optical device.

FIG. 2 illustrates a block diagram 200 of a controller in a configuration for digitally controlling an electro-optical device. Shown in FIG. 2 are a laser 108, a pattern generator 110, a laser driver 112, a communications signal analyzer 114, a host computer 202, a graphical user interface (GUI) 204, a microcontroller 206, a controller interface 208, an electro-optical system configuration database 210, an application module library 212, and an internal electro-optical system configuration database 214.

In FIG. 2, the electro-optical system is the laser 108 of FIG. 1; however, other types of electro-optical systems including, for example, laser diodes, may be used to practice various embodiments within the scope of the appended claims. The microcontroller 206 includes the electro-optical system configuration database 214, which includes configuration data for one or more electro-optical systems. The configuration data includes set parameters that are specific to the electro-optical system 108 such as the nominal drive current, the maximum allowed drive current, the maximum allowed temperature of the electro-optical system, laser set points for the optical output power levels $P_{LOW}$ and $P_{HIGH}$, scaling factors for analog-to-digital converters (ADC) and digital-to-analog converters (DAC), calibration parameters for formula models, device characteristics tables, driver parameters, wavelength tuning parameters, power supply parameters, and other information about the electro-optical system.

In one embodiment, the configuration data for one or more electro-optical systems is downloaded from the electro-optical system configuration database 210 in the host computer 202 into the internal electro-optical system configuration database 214 in the reconfigurable microcontroller 206 when the microcontroller 206 is put in service and periodically thereafter as needed for maintenance. Once the electro-optical system configuration database 210 is downloaded from the host computer 202, the microcontroller 206 can operate independently from the electro-optical system configuration database 210 in the host computer 202, even when used with electro-optical systems other than the electro-optical system 108.

The microcontroller 206 performs a sequence of desired operations on the electro-optical system 108 as a function of the configuration data for the selected electro-optical system 108 and optionally from user input via the graphical user interface (GUI) 204 in the host computer 202. In one embodiment, the microcontroller 206 sends the results of the operations to the host computer 202. For example, the configuration data for the selected electro-optical system 108 may indicate that the selected electro-optical system 108 has not yet been calibrated.

The controller interface 208 passes digital values of the set parameters from the microcontroller 206 to the electro-optical system 108 and the analog values of the measured parameters from the electro-optical system 108 to the microcontroller 206, for example, via analog-to-digital converters and digital-to-analog converters in the controller interface 208.

The electro-optical system 108 may be, for example, a commercially available optical transceiver used for fiber-optic communications, a liquid crystal backlight system, or any other electro-optical device used to emit light in response to an electrical stimulus. A wide variety of electro-optical systems for electro-optical devices including lasers, laser diodes, light-emitting diodes, and cold cathode fluorescent lamps are commercially available, and other electro-optical systems in a variety of applications may also be used to practice various embodiments within the scope of the appended claims. The electro-optical system 108 typically includes sensor devices for measuring parameters such as optical output power, drive current, optical output wavelength, and the operating temperature of the electro-optical system.

The controller interface 208 includes, for example, power devices for providing power to the electro-optical system and sensor devices for measuring light power output and other parameters, such as temperature. The controller interface 208 may also include typical input/output (I/O) circuitry, analog-to-digital converters (ADC), and digital-to-analog converters (DAC) for interfacing one or more digital I/O ports in the microcontroller 206 to analog and/or digital ports in the electro-optical system 108. The microcontroller 206 and the controller interface 208 may be, for example, integrated into a single integrated circuit, or they may be separate circuits each equipped with standard connectors for connecting to each other and to the electro-optical system 108 by electrical cables. In another embodiment, the controller interface 208 is integrated with the electro-optical system 108 to provide a standard control/data communications interface that is compatible with the microcontroller 206.

The host computer 202 may be, for example, a personal computer (PC) such as a desktop or notebook computer that has an I/O port for communicating information between the user and the microcontroller 206, for example, via the graphical user interface (GUI) 204. The GUI 204 includes, for example, a display and a user data entry device such as a mouse and/or keyboard. The host computer 202 also includes internal or external storage media such as a disk drive for storing an application program module library 212 and the electro-optical system configuration database 210.

The electro-optical system configuration database 210 includes configuration data for multiple electro-optical devices and values for the set parameters that are specific to each electro-optical system. Each electro-optical system typically has different configuration data and values for the set parameters that are specific to each type of electro-optical system and even to different models of the same type of electro-optical system. Examples of data in the electro-optical system configuration database 210 include parameters for equations that are computed by the microcontroller 206, maximum and nominal values of drive current for lasers, and firing voltages for various models of fluorescent lamps. The information for constructing the electro-optical system configuration database 210 may be obtained, for example, from various manufacturers of electro-optical devices. In one embodiment, the electro-optical system configuration database 210 is downloaded by the microcontroller 206 and stored in the microcontroller 202 as the internal electro-optical system configuration database 214 so that the microcontroller 206 can operate standalone without the host computer 202.

In one embodiment, the electro-optical system configuration database 214 is stored in non-volatile memory with parameter values for calculating equations including parameters for wavelength tuning parameters, driver information, temperature sensor information, power supply information, wavelength tuner parameters, device characteristics and tables, set points, flags, or any other information related to the electro-optical system 108. Examples of these parameters include target peak power PH, current temperature TS, current threshold IT, current slope of modulation characteristic GL, current slope of bias characteristic G2, A/D converter counts that represent monitor photodiode readings, modulation and bias D/A converter counts, servo gain KG, and servo set point.

During operation, various application program modules set and read parameters from the internal electro-optical system configuration database 214 for calculating equations. For example, one application program module includes calculating an equation to determine the amount of bias counts to set on the bias DAC from the current slope of modulation characteristic GL. The value of the current slope of modulation characteristic GL is unchanged until it is updated by either another application program module or the graphical user interface (GUI) 204. Another application program module may determine that for a certain temperature, the current slope of the modulation characteristic GL needs to be recalculated, and the application program module will update the value of the current slope of the modulation characteristic GL in the internal electro-optical system configuration database 214 with the new value. The value of the current slope of the modulation characteristic GL may be retrieved periodically from the internal electro-optical system configuration database 214, to update the bias DAC counts.

Alternatively, the graphical user interface (GUI) 204 may send a value to the configuration database such as the servo set point. Each cycle of the servo fetches the servo set point from the internal electro-optical system configuration database 214 while calculating the feedback error. If the set point has been changed, the feedback error will change and the servo will adjust its operation accordingly.

The application program module library in the host computer 202 includes a set of application program modules in firmware that may be used to perform a variety of functions such as the examples described above in the microcontroller 206 for the laser 108 or other electro-optical system. The application program modules may be compiled and maintained on the host computer 202, for example, by electro-optical system design engineers. In one embodiment, the application program modules are downloaded from the application program module library 212 in the host computer 202 to the microcontroller 206 when the microcontroller 206 is put in service and periodically thereafter for maintenance. Once the application program modules are loaded into the microcontroller 206, the microcontroller 206 executes instructions from the application program modules stored in the microcontroller 206 independently from the host computer 202, even when used with electro-optical systems other than the electro-optical system 108.

FIG. 3 illustrates a detailed block diagram of the microcontroller 206 of FIG. 2. Shown in FIG. 3 are a central processing unit (CPU) 302, a main program memory 304, an application program module memory 306, a common data memory 308, an internal electro-optical system configuration database 214, a host computer I/O port 312, and a controller interface I/O port 314.

In FIG. 3, the central processing unit (CPU) 302 may be, for example, a microprocessor or other circuit capable of executing instructions from a computer program. The main program memory 304 may be, for example, a flash memory for holding the main program module executed by the microcontroller 206. The program module memory 306 may be, for example, a flash memory for holding the program code for a set of application program modules that are selected and downloaded from the host computer 202. The common data memory 308 may be, for example, random-access memory (RAM) for storing and retrieving inputs and outputs for the application program modules, including intermediate computations that are generated by the application program modules.

The application program module memory 306, the common data memory 308, and the internal electro-optical system configuration database 214 may be physically separate devices as shown in FIG. 3. In other embodiments, the program module memory 306, the common data memory 308, and the internal electro-optical system configuration database 214 may each occupy a separate address range on the same memory device.

The host computer I/O port 312 may be, for example, an RS-232 port or an I2C port for connecting the microcontroller 206 to the host computer 202 in FIG. 2.

The controller interface I/O port 314 may be, for example, one or more parallel and/or serial I/O ports for connecting the microcontroller 206 to the controller interface 208.

The controller interface 208 interfaces the microcontroller 206 with components of the electro-optical system such as digital-to-analog converters, analog-to-digital converters, and pulse-width modulators.

In one embodiment, a user selects an electro-optical system, for example, from a list displayed on the graphical user interface (GUI) 204 of FIG. 2 and selects a function, for example, calibration, to be performed on the electro-optical system. The host computer 202 sends the identifying information for the selected electro-optical system and the function to be performed to the microcontroller 206 via the host computer I/O port 312.

In another embodiment, the microcontroller 206 operates standalone without the host computer 202, even when the electro-optical system is replaced with a different electro-optical system. As long as the configuration data for the electro-optical system is included in the internal electro-optical system configuration database 214, the microcontroller 206 can reconfigure itself for different electro-optical systems without user input and without the host computer 202.

The main program module executed by the CPU 302 from the main program memory 304 executes the application program modules needed to perform a desired function of the configuration data for the electro-optical system 108 stored in the internal electro-optical system configuration database 214. For example, the configuration data for a certain model of a laser may include specific values for parameters A, B, and C that are inputs for an equation in an application program module for calibration. For some operations, only one application program module may be required; other more complex operations may require several application program modules. Because the configuration data for the electro-optical system is pre-loaded in the internal electro-optical system configuration database 214, delays and errors that may result from a user's lack of knowledge of the electro-optical device parameters may be advantageously avoided.

The microcontroller 206 can operate independently of the host computer 202, and the host computer 202 may be disconnected from the microcontroller 206 if no further communication with the user via the graphical user interface (GUI) 204 is desired. The microcontroller 206 invokes the application program modules in the appropriate sequence under the direction of the main program module according to the configuration data stored in the internal electro-optical system configuration database 214 for any electro-optical device that is included in the internal electro-optical system configuration database 214.

Each of the application program modules in the microcontroller 206 receives input parameter values from the internal electro-optical system configuration database 214 and/or the common data memory 308. The common data memory 308 may also store intermediate computations and results generated by the application program modules. The common data memory 308 advantageously allows communication of intermediate computations and results among the application program modules outside the application program module memory 306, so that data generated by the application program modules may be managed and monitored more efficiently than in an arrangement in which the application program modules communicate with one another through variables that may be inconveniently scattered throughout the application program module code. For example, different application program modules for temperature compensation and servo control can communicate values for bias current and modulation current between each other using the same locations in the common data memory 308 and/or the electro-optical system configuration database 214. This feature avoids having to coordinate the exchange of variables between the application program modules each time the microcontroller 206 is reconfigured with a different set of application program modules.

When the application program modules have completed their computations, the main program module can transfer the results from the common data memory 308 and/or the internal electro-optical system configuration database 214 to the host computer I/O port 312, for example, to display to the user via the GUI 204 of FIG. 2.

As may be appreciated from FIG. 3, the microcontroller 206 may be reconfigured for each electro-optical device in the internal electro-optical system configuration database 214 without replacing the microcontroller hardware or manually reprogramming the microcontroller software. Also, updates to the application program modules may be performed as needed in the host computer 202 of FIG. 2 and stored in the application program module library 306. The application program modules may be downloaded into the application program module memory 306 periodically, ensuring that the microcontroller 206 always uses the most current version of each application program module.

Once the application program modules have been downloaded into the application program module memory 306 from the host computer 202, the microcontroller 206 executes the application program modules independently from the host computer 202. Unless communication between the microcontroller 206 and the user via the GUI 204 is desired, the host computer 202 may be disconnected from the microcontroller 206 to perform the functions of the application program modules.

Find Threshold Application Program Module

In one embodiment, a method and firmware for finding a laser threshold include steps of:

recording a corresponding value of optical output power for each of a number of selected values of bias current to generate a series of data points for a transfer function of the electro-optical system;

calculating a slope of the transfer function for each of the data points;

sorting the data points according to slope value into groups of low, medium, and high slope values;

finding an equation of a first line through the group of data points having low slope values;

finding an equation of a second line through the group of data points having high slope values;

calculating an intersection point of the first and second lines; and generating as output the value of threshold current from the intersection point.

Figure 4A:
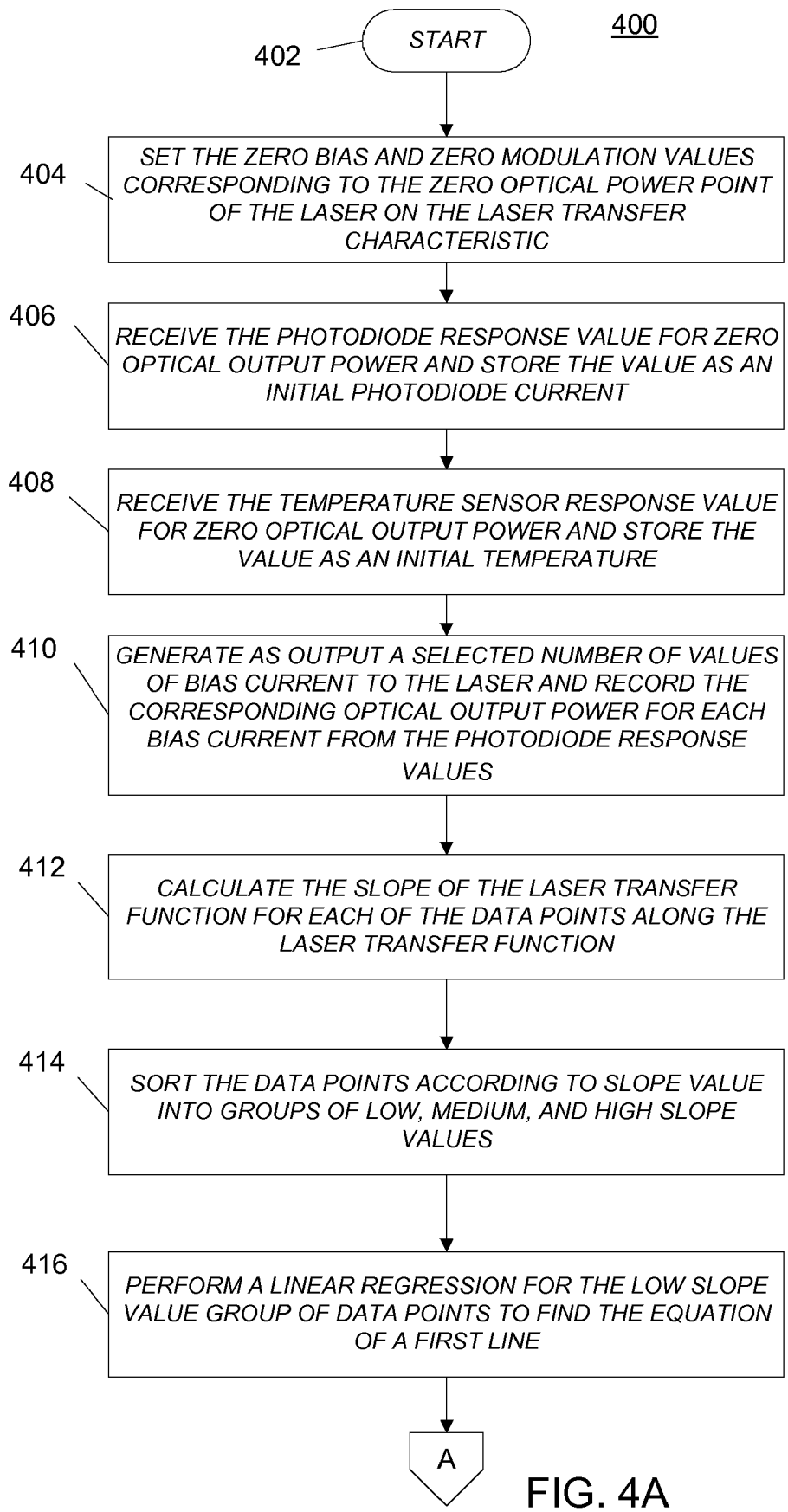
FIG. 4 illustrates a flow chart of an application program module for finding a laser threshold for the microcontroller of FIG. 2.
Figure 4B:
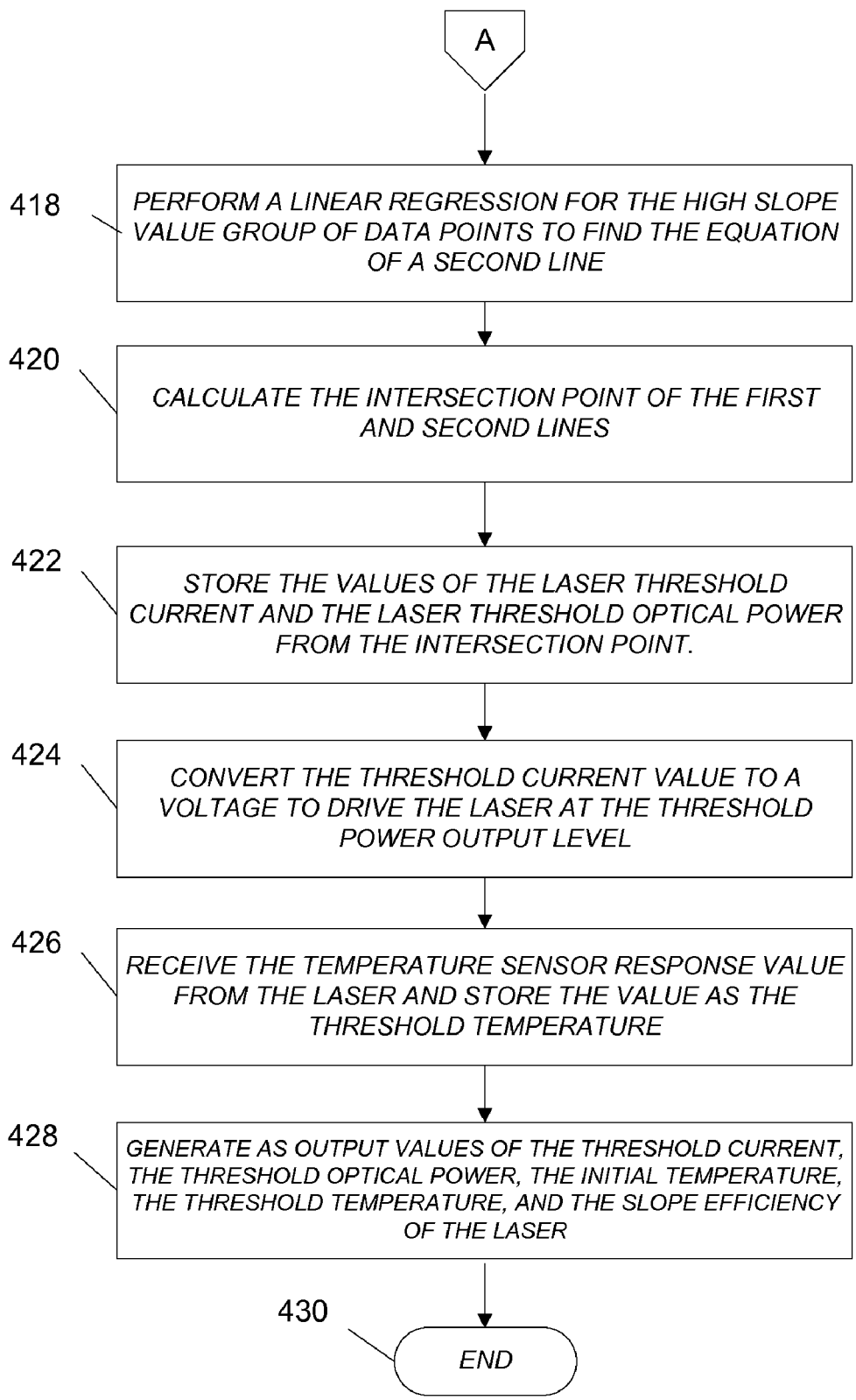

FIG. 4 illustrates a flow chart 400 of an application program module for finding a laser threshold for the microcontroller 206 of FIG. 3.

Step 402 is the entry point for the flow chart 400.

In step 404, the microcontroller 206 sets the zero bias and zero modulation values corresponding to the zero optical power point of the laser on the laser transfer characteristic.

In step 406, the microcontroller 206 receives the photodiode response value representative of the laser optical power for zero optical output power and stores the photodiode response value as an initial photodiode current.

In step 408, the microcontroller 206 receives the temperature sensor response value for zero optical output power and stores the temperature sensor response value as an initial temperature.

In step 410, the microcontroller 206 generates as output a selected number of values of bias current to the laser and records the corresponding optical output power for each value of bias current from the photodiode response values to generate a series of data points for the laser transfer function. By automating the measurement with the microcontroller 206, the series of data points may be measured, for example, over a time period of about 100 milliseconds.

In step 412, the microcontroller 206 calculates the slope of the laser transfer function for each of the data points along the laser transfer function according to well-known techniques.

In step 414, the microcontroller 206 sorts the data points according to slope value into groups of low, medium, and high slope values.

In step 416, the microcontroller 206 performs a linear regression for the low slope value group of data points according to well-known techniques to find the equation of a first line through the low slope value group of data points.

In step 418, the microcontroller 206 performs a linear regression for the high slope value group of data points to find the equation of a second line through the high slope value group of data points.

In step 420, the microcontroller 206 calculates the intersection point of the first and second lines.

In step 422, the microcontroller 206 stores the values of the laser threshold current and the laser threshold optical power from the intersection point. The slope of the second line defines the slope efficiency of the laser.

In step 424, the microcontroller 206 converts the threshold current value to a voltage to drive the laser at the threshold power output level.

In step 426, the microcontroller 206 receives the temperature sensor response value from the laser and stores the value as the threshold temperature.

In step 428, the microcontroller 206 generates as output the values of the threshold current, the threshold optical power $P_{LTH}$, the initial temperature, the threshold temperature, and the slope efficiency of the laser. In another embodiment, the microcontroller 206 sends the data points to the host computer 202 for displaying a plot of the laser transfer characteristic to a user via the graphical user interface (GUI) 204 of FIG. 2. The microcontroller 206 may perform the find laser threshold module automatically at pre-selected time intervals or in response to an event, for example, a change in laser operating temperature measured by the temperature sensor.

Step 430 is the exit point for the flow chart 400.

Figure 5:
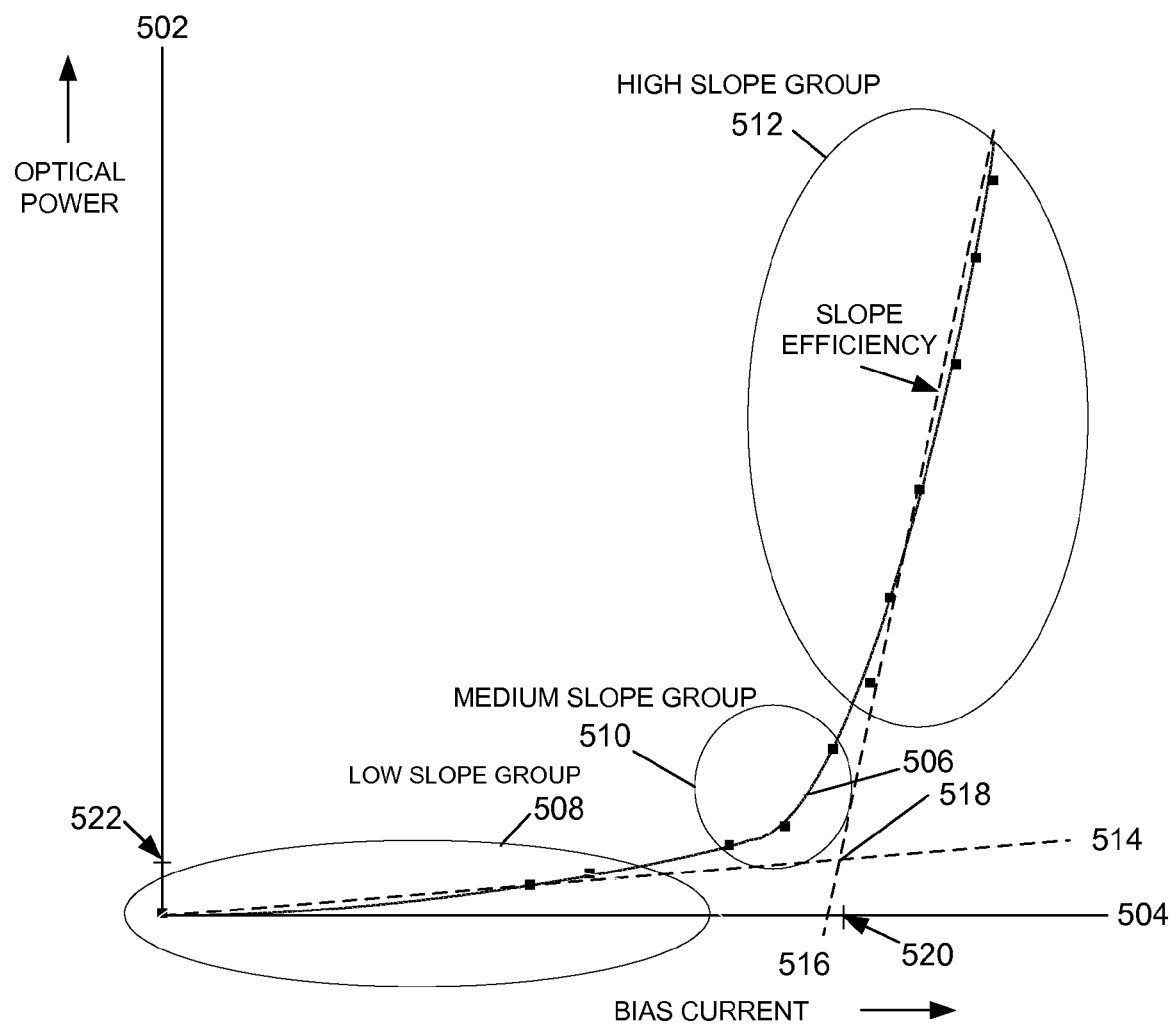
FIG. 5 illustrates a plot of a laser transfer function and a laser threshold determined from the application program module of FIG. 4.

FIG. 5 illustrates a plot 500 of a laser transfer function and a laser threshold generated as output from the application program module of FIG. 4. Shown in FIG. 5 are a laser optical power axis 502, a bias current axis 504, a laser transfer function 506, data point groups 508, 510, and 512, a first line 514, a second line 516, an intersection point 518, a threshold current value 520, and a threshold optical power 522.

In FIG. 5, the microcontroller 206 records the data points 508, 510, and 512 in the laser transfer function space defined by the laser output power axis 502 and the bias current axis 504 for the electro-optical system as described in the flow chart of FIG. 4. The microcontroller 206 sorts the data points into the low slope data point group 508, the medium slope data point group 510, and the high slope data point group 512. The data points in the low slope data point group 508 and the high slope data point group 512 may be determined, for example, by comparing the slope of each data point with the slope of the previous data point and terminating the group when the difference in slope exceeds a selected threshold, for example, 10 percent.

The equation of the first line 514 may be found by performing a linear regression on the data points in the low slope data point group 508. The equation of the second line 516 is found by performing a linear regression on the data points in the high slope data point group 512. The intersection point 518 of the lines 514 and 516 defines the threshold current value 520 and the threshold output power 522. The slope of the line 516 defines the laser slope efficiency. The laser slope efficiency may be re-calculated automatically, for example, each time the find threshold module is performed.

A logic low state bias current equal to the threshold current plus an additional bias margin current is applied to the laser to provide a margin above the threshold region. An initial value of bias margin current may be set by the user, or the initial bias margin current may have a default digital value. For example, the bias margin current may be set equal to the threshold current, so that the total low state bias current is equal to twice the threshold current. Operating the laser above the threshold region avoids laser noise and slow turn-on that may adversely affect laser performance. The optical power $P_{LOW}$ produced by the electro-optical system from the logic low state bias current is recorded by the micro processor 206 in the electro-optical system configuration database 210.

The micro processor 206 measures and records the laser temperature for the optical power $P_{LOW}$.

A value of peak modulation optical power for the logic high state $P_{HIGH}$ is received as input by the micro processor 206, for example, from the user via the GUI 204 or the electro-optical system configuration database 214. The micro processor 206 maintains the optical output power $P_{LOW}$ by performing steps I through III.

I. Measure the laser operating temperature.

II. Calculate an adjustment to the bias margin current to compensate for changes in the laser operating temperature over time, for example, by the Calculate bias margin current application program module.

III. Load the bias current DAC of the electro-optical system with the logic low state bias current including the adjustment to the bias margin current.

The micro processor 206 maintains the peak modulation current, for example, by the Servo control application program module. The combination of the Calculate bias margin current application program module and the Servo control application program module ensure that the logic low state optical output power $P_{LOW}$ and the peak-to-peak modulation optical output power $P_{HIGH}$ are driven toward the digital set point values entered by the user via the Graphical User Interface (GUI) 204 or pre-defined in the internal electro-optical system configuration database 214.

Calculate Bias Margin Current Initialization Application Program Module

Figure 6:
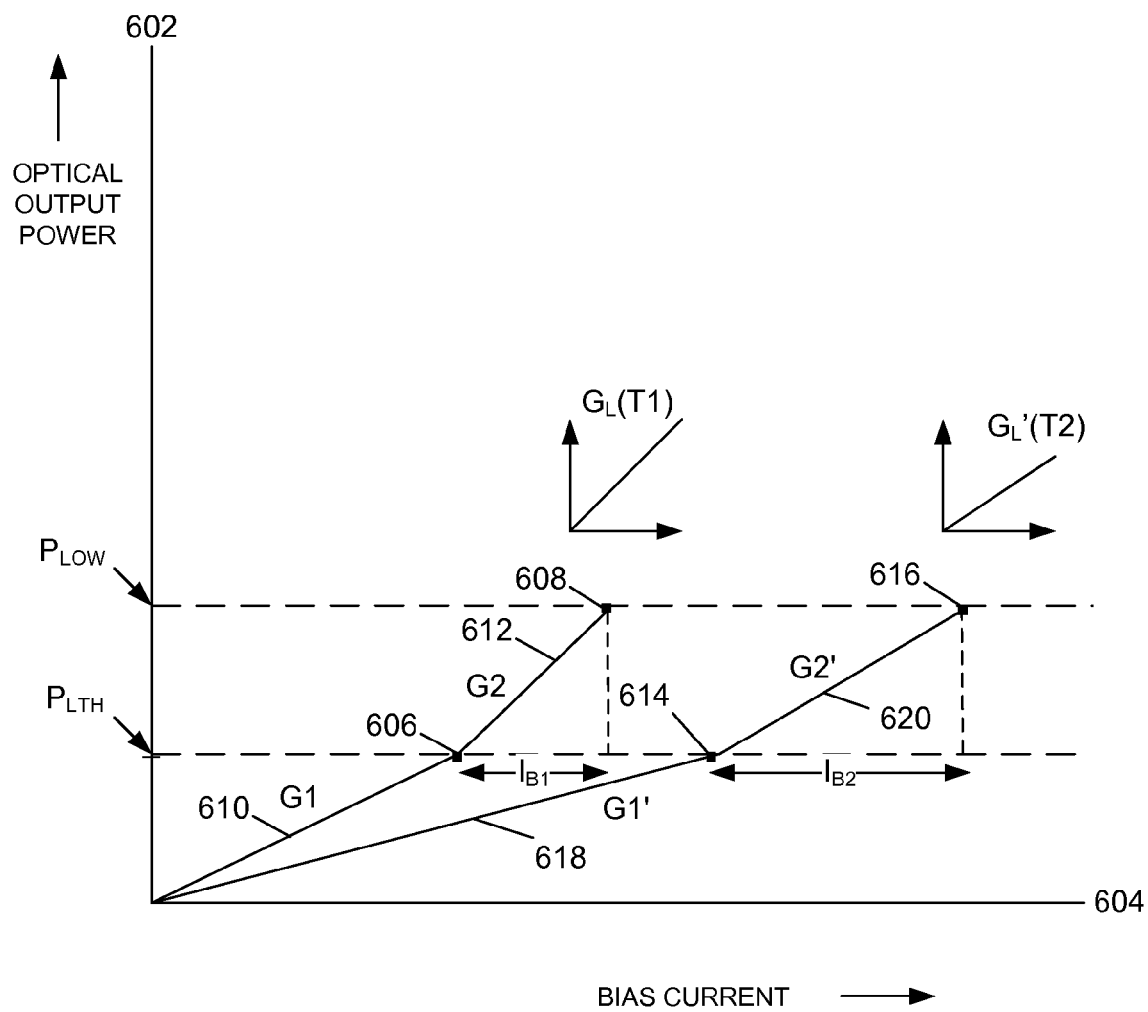
FIG. 6 illustrates a plot illustrating the calculation of laser bias current as a function of temperature for the microcontroller of FIG. 2

FIG. 6 illustrates a plot 600 illustrating the calculation of laser bias current as a function of temperature for the microcontroller of FIG. 2. Shown in FIG. 6 are an optical output power axis 602, a bias current axis 604, a laser threshold operating point $P_{LTH}$ 606 at a first temperature T1, a logic-low state $P_{LOW}$ operating point 608 at temperature T1, a laser threshold current slope G1 610 at temperature T1, a laser bias current slope G2 612 at temperature T1, a laser threshold operating point 614 at a second temperature T2, a logic-low state operating point 616 at temperature T2, a laser threshold current slope G1' 618 at temperature T2, and a laser bias current slope G2' 620 at temperature T2.

Figure 7:
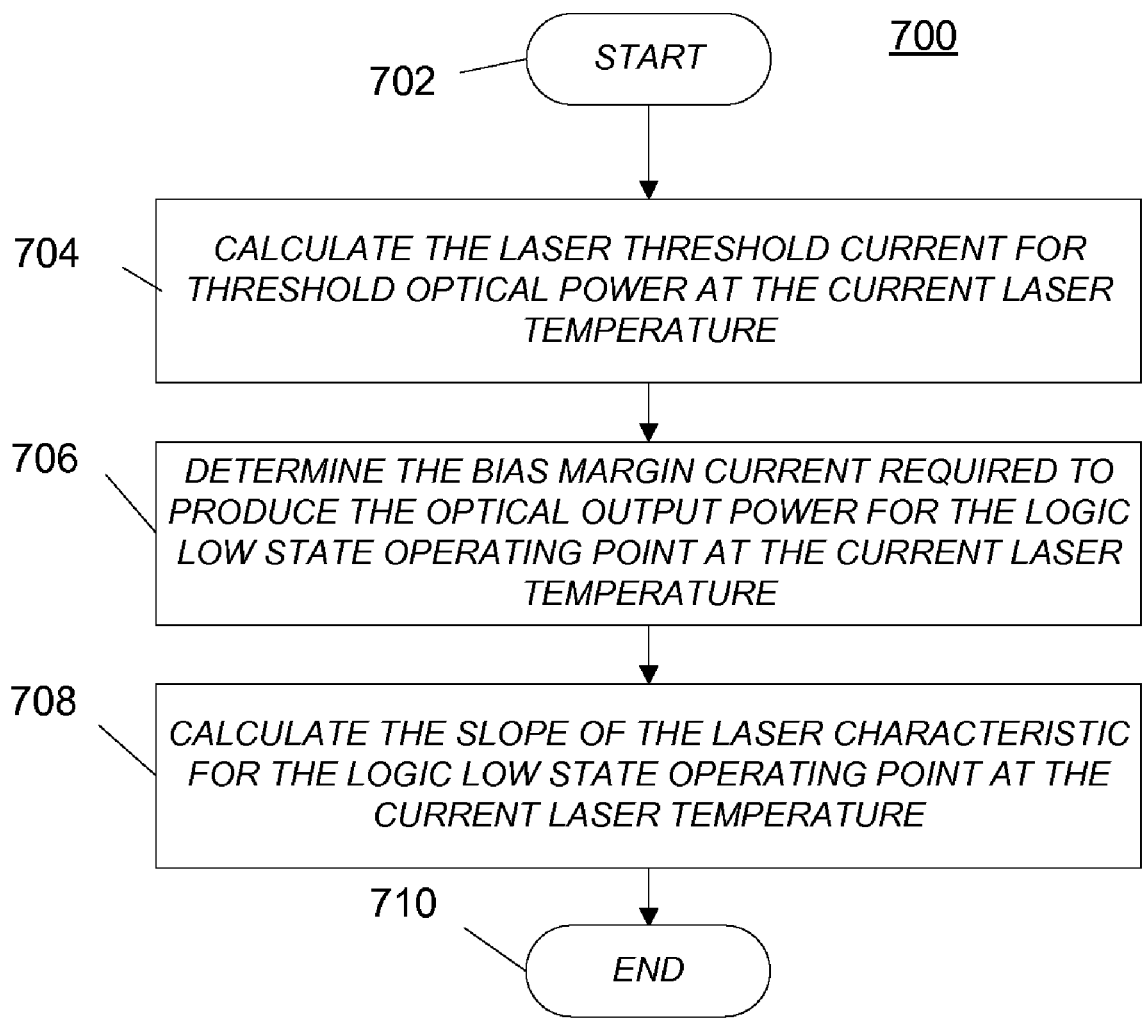
FIG. 7 illustrates a flow chart for an application program initialization module for calculating an adjustment to the bias margin current for the optical power $P_{LOW}$ for the logic low state according to FIG. 6.

FIG. 7 illustrates a flow chart 700 for an application program initialization module for calculating an adjustment to the bias margin current for the logic-low state $P_{LOW}$ according to FIG. 6. This initialization is run at calibration time before normal operation. During normal operation, the bias margin program is run.

Step 702 is the entry point of the flow chart 700.

In step 704, the microcontroller 206 calculates the laser threshold current $I_{LTH}$ for threshold optical power $P_{LTH}$ at the current laser temperature, for example, using the Find threshold application program module.

In step 706, the microcontroller 206 determines the bias margin current $I_{B1}$ required to produce the optical output power $P_{LOW}$ for the logic low state operating point 608 at temperature T1 in FIG. 6 when combined with the threshold current $I_{LTH}$. The bias current $I_{LOW}$ is determined by increasing counts in the digital-to-analog converter 848 in FIG. 8 until $P_{LOW}$ is reached, then the bias margin current $I_{B1}$ is calculated, for example, from the following equation:

$$I_{B1}=I_{LOW}-I_{LTH} \quad (1)$$

In step 708, the microcontroller 206 calculates the slope GL 612 of the laser characteristic at $P_{LOW}$ according to the equation $$GL=(P_{LOW}-P_{LTH})/I_{B1} \quad (2)$$

assuming that G2=GL in FIG. 6.

Step 710 is the exit point of the flow chart 700.

By periodically repeating the steps in FIG. 7 at different temperatures, the laser threshold current $I_{LTH}$ and the modulation slope GL may be determined as a function of temperature that may be used to maintain the optical output power for the logic-low state $P_{LOW}$ constant as the laser operating temperature changes over time.

Servo Control Application Program Module for Controlling Modulation Power

Figure 8:
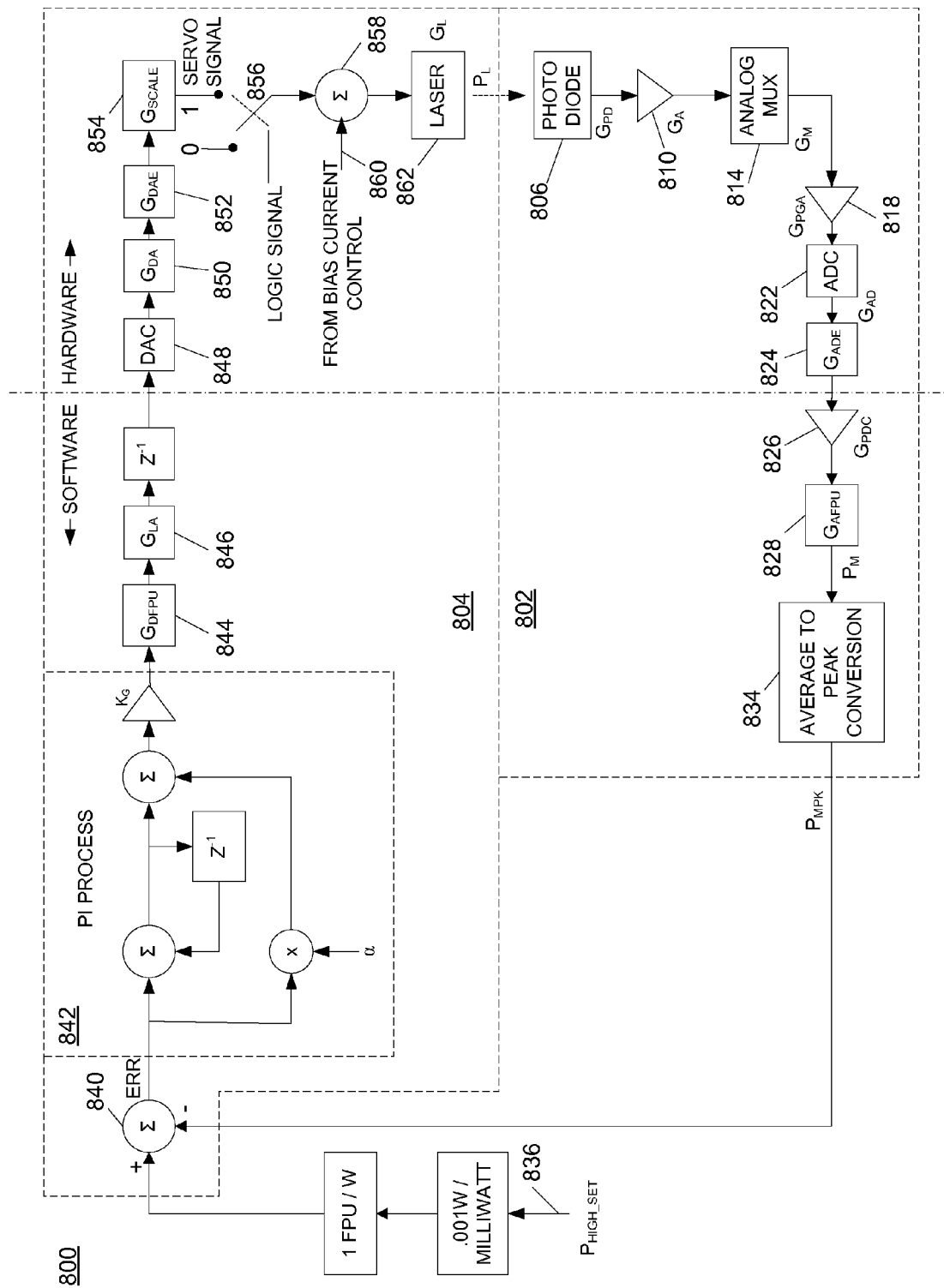
FIG. 8 illustrates a functional block diagram of a servo control loop for maintaining optical output power of an electro-optical system at an optical output power set point for the microcontroller of FIG. 2.

FIG. 8 illustrates a functional block diagram 800 of a servo control loop for maintaining optical output power of an electro-optical system at an optical output power set point for the microcontroller of FIG. 2. Shown in FIG. 8 are a feedback servo control path 802, a forward servo control path 804, a photodiode sensor 806, a photodiode gain $G_{PD}$, a transimpedance amplifier 810, a transimpedance amplifier gain $G_A$, an analog multiplexer 814, an analog multiplexer gain error $G_M$, a programmable gain amplifier 818, a programmable gain amplifier gain $G_{PGA}$, an analog-to-digital converter 822, an analog-to-digital converter transfer gain $G_{AD}$, an analog-to-digital converter error $G_{ADE}$ 824, a gain multiplier $G_{PDC}$ 826, a feedback arithmetic conversion factor $G_{AFPU}$ 828, a measured average power $P_M$, an average-to-peak operation 834, a measured peak power $P_{MPK}$, an optical output power set point $P_{HIGH\_SET}$ 836, an optical power summing amplifier 840, a proportional integral servo 842, a forward arithmetic conversion factor $G_{DFPU}$ 844, a forward gain factor $G_{LA}$ 846, a digital-to-analog converter 848, a digital-to-analog converter transfer gain $G_{DA}$ 850, a digital-to-analog converter error $G_{DAE}$ 852, a forward gain scale factor $G_{SCALE}$ 854, a modulation switch 856, a bias current summing amplifier 858, a bias current 860, a laser 862, a laser slope efficiency $G_L$, and a laser optical output power $P_L$.

In FIG. 8, the forward servo control path 804 for and the feedback control path 802 are divided into a software portion and a hardware portion. In the software portion, measured and set parameters have digital values. In the hardware portion, the measured and set parameters have analog values. In one embodiment, the digital values are processed by the microcontroller 206 in floating point arithmetic. By minimizing the number of analog components in the servo control loop 800, errors resulting from temperature changes are minimized.

In the feedback servo control path 802, the optical power modulation output $P_L$ is measured by the photo diode sensor 806 and sampled by the analog multiplexer 814. The analog samples are converted to digital data by the analog-to-digital converter 822. The digital data is processed by the firmware in an average-to-peak operation 834 that multiplies the average modulation power without bias Pma by two to generate the measured peak value according to $$Pma=\text{get\_photodiode reading}; \quad (3)$$

$$P_{MPK}=Pma*2$$

In another embodiment, the feedback may be provided by a sample and hold circuit coupled to a fast photodetector that senses the instantaneous laser power. The sample to hold transition time may be determined by a synchronizer circuit that synchronizes the sampling interval to a logic high state.

In the forward control path 804, the measured peak value $P_{MPK}$ is subtracted from the optical output power set point 836 by the optical power summing operation 840 to generate the modulation power output error err according to $$err = PHigh\_Set - PMPK \quad (4)$$

The resulting feedback error err from the optical power summing amplifier 840 is subjected to the proportional integral servo 842 to generate an adjustment to the modulation current according to $$Pint = (\alpha * err + int\_last) * KG \quad (5)$$

where
$P_{INT}$ is the integrated error output;
$\alpha$ is a feedback constant;
int_last is the cumulative sum of the current and previous values of err; and
$K_G$ is a loop gain constant.

In one embodiment, the loop gain $K_G = 1.975 \times 10^{-3}$ and $\alpha = 39.5$ to provide a damping ratio of 0.9 to allow for open loop variation tolerances. In this example, the sampling frequency of the optical output power is 50 Hz, and the servo loop is performed at periodic intervals of five seconds.

The error err is summed with the previous errors:

$$int\_last = int\_last + err \quad (6)$$

The proportional integral servo 842 is preferably embodied in firmware according to well-known programming techniques and performed by the microprocessor 206.

The result Pint is multiplied by a forward gain factor GLA to determine the value of the digital-to-analog converter 822 according to:

$$tmp\_float = Pint * GLA * 4095 \quad (7)$$

The resulting digital value of the adjusted modulation current tmp_float is loaded into the digital-to-analog converter 848, and the analog value of the adjusted modulation current is gated by the modulation switch 856 to the bias current summing amplifier 858. The bias current summing amplifier 858 adds the logic low bias current to the modulation current, and the sum of the logic low bias current and the modulation current drives the laser 862.

Calculate Bias Margin Current Application Program Module

The logic low bias current is initialized as described above with reference to FIGS. 6 and 7, that is, the slope of the laser characteristic at $P_{LOW}$ is calculated according to the equation $$GL = (P_{LOW} - P_{LTH})/I_{B1} \quad (8)$$

assuming that G2=GL in FIG. 6, where $I_{B1}$ is the bias margin current required to produce the optical output power $P_{LOW}$ for the logic low state operating point 608 at temperature T1. The laser bias current slope G2' 620 at temperature T2 is given by the equation $$GL' = (P_{LOW} - P_{LTH})/I_{B2} \quad (9)$$

assuming that G2'=GL' in FIG. 6, where $I_{B2}$ is the bias margin current required to produce the optical output power $P_{LOW}$ for the logic low state operating point 616 at temperature T2. Dividing equation (8) by equation (9) gives the equation $$I_{B2} = GL/GL' * I_{B1} \quad (10)$$

After the modulation current value is determined from the servo as described above, the bias current value for the digital-to-analog converter is calculated from the slope of the modulation current between the data points (0, 0) and (IMAV, PT) from a plot of modulation power vs. modulation current generated, for example, sampled during servo operation. IMAV is the current value output from the modulation digital-to-analog converter 848, and PT is the power set point for laser modulation. The modulation slope GL may be calculated, for example, according to $$GL = PT/IMAV \quad (11)$$

In another embodiment, the modulation slope GL is calculated for a temperature T2 from a model of modulation current as a function of temperature, for example, $$GL(T2) = GL0 + GL1(T2-T0) + GL2(T2-T0)^2 \quad (12)$$

where GL0, GL1, and GL2 are polynomial temperature coefficients that are determined during calibration of the laser at the calibration temperature T0 as described above. The temperature coefficients are obtained by plotting data points of the modulation current as a function of temperature and finding a polynomial that best fits the data points. In one embodiment, the polynomial coefficients GL0, GL1, and GL2 are saved in the internal electro-optical system configuration database 214 that is accessed by the microcontroller 206.

The bias current $I_{B2}$ at the temperature T2 may be calculated, for example, from the equation $$I_{B2} = GL/GL' * I_{B1} \quad (13)$$

In one embodiment, the laser threshold current IT is calculated at the new temperature T2 from a model of threshold current as a function of temperature, for example, $$IT(T2) = IT0 + IT1(T2-T0) + IT2(T2-T0)^2 \quad (14)$$

where IT0, IT1, and IT2 are polynomial temperature coefficients that are determined during calibration of the laser at the calibration temperature T0 as described above. The temperature coefficients IT0, IT1, and IT2 are obtained by plotting data points of the laser threshold current as a function of temperature and finding a polynomial that best fits the data points. In one embodiment, the polynomial coefficients IT0, IT1, and IT2 are saved in the internal electro-optical system configuration database 214 that is accessed by the microcontroller 206.

The total bias current IBT may be calculated, for example, according to the equation $$IBT = I_{B2} + IT(T2) \quad (15)$$

The total DC gain $G_{FT}$ of the feedback servo control path 802 in floating point units per watt (fpu/W) is given by the equation $$G_{PD} \cdot G_A \cdot G_M \cdot G_{PGA} \cdot G_{ADE} \cdot G_{AD} \cdot G_{PDC} \cdot G_{AFPU} = G_{FT} = 1 \, fPu/W \quad (16)$$

The total DC gain $G_{FT}$ of the feedback servo control path 802 may be calibrated, for example, by an optical power meter at two different levels of laser power output received by the photodiode to produce a calibrated gain constant that lumps all the gain errors for the photodiode sensor 806, the transimpedance amplifier 810, the analog multiplexer 814, the programmable gain amplifier 818, and the an analog-to-digital converter 824.

The total DC gain $G_{TF}$ of the forward servo control path 804 in Watts per floating point unit (W/fpu) may be calculated to produce a calibrated gain constant that lumps all the gain errors in the forward servo control path 804 from the equation $$G_{DFPU} \cdot G_{LA} \cdot G_{DA} \cdot G_{DAE} \cdot G_{SCALE} \cdot G_L' = G_{TF} = 1 \, W/fpu \quad (17)$$

All of the variables in equations (1)-(17) including servo variables such as the servo gain KG and the damping coefficient ∀ may be stored in the electro-optical system configuration database 210 by the microcontroller 206 in FIG. 2.

By incorporating digital components such as the analog-to-digital converter 824 in the feedback servo control path 802, the error normally associated with analog components in analog servo control loops is advantageously avoided.

In one embodiment, the average power servo control loop of FIG. 8 is run every five seconds to maintain the set point average modulation power.

Digital Servo Control Summary

In one embodiment, a method of digital servo control for an electro-optical device maintains stable optical output power. A digital control system automatically sets and adjusts bias current and modulation current to maintain desired set point values for the logic low state and the logic high state used to modulate a laser with a data signal. The microcontroller 206 maintains the peak modulation current, for example, by the Servo control application program module. The combination of the Calculate bias margin current application module and the Servo control application program module ensure that the optical output power $P_{LOW}$ in the logic low state and the peak modulation optical output power $P_{HIGH}$ in the logic high state are maintained at the desired levels set by the user via the Graphical User Interface (GUI) 204 or pre-defined in the internal electro-optical configuration database 214.

The method of digital servo control may be implemented, for example, as a computer readable storage medium tangibly embodying instructions that when executed by a computer implement a method for digitally controlling an electro-optical device, the method including steps of:
 (a) receiving as input an operating temperature of the electro-optical system;
 (b) calculating a value of threshold current for the electro-optical system as a function of the operating temperature;
 (c) providing a logic low state bias current equal to the threshold current plus a bias margin current to the electro-optical system to produce an optical output power $P_{LOW}$ for a logic low state at the operating temperature; and
 (d) automatically adjusting the logic low state bias current to maintain the optical output power of the electro-optical system for the logic low state at the optical output power $P_{LOW}$ as a function of the operating temperature when the operating temperature varies over time.

Servo Control Application Program Module for Controlling Bias Power

In another embodiment, the digital servo control loop of FIG. 8 may be reversed and performed on the bias path of the laser to control $P_{LOW}$, and the peak modulation optical output power $P_{HIGH}$ is set according to a formula model. The method may be implemented as firmware in a computer readable medium such as non-volatile random access memory (RAM), read-only memory (ROM), compact disks (CDs), and other well-known computer storage media used to load instructions into computers. The firmware includes the following steps:
 receiving a value of an optical output power set point;
 subtracting a measured peak optical output power of the laser from the optical output power set point to generate a feedback error;
 multiplying the feedback error times a feedback constant to generate a feedback product;
 adding a cumulative sum of the feedback error to the feedback product to generate a feedback sum;
 and multiplying the feedback sum by a loop gain constant to generate an adjustment to a laser modulation current.

Servo Data Log Application Program Module

Each time a servo loop is performed by the Servo control application program module, the parameters that characterize the servo performance are recorded in a servo data log by the microcontroller 206 and sent to the host computer 202. The host computer may then display the parameters on the Graphical User Interface (GUI) 204 for evaluating the performance of the servo control in a specific electro-optical system with variation in temperature. Alternatively, the parameters may be stored by the host computer and retrieved at run time to analyze servo control performance using a spreadsheet on the Graphical User Interface (GUI) 204.

The servo data log records the information of the critical parameters that determine servo performance. Each time the servo loop is executed, the values of several servo variables are recorded in the host computer 202. Examples of critical parameters are power, threshold current, and servo gains. The recorded information may be used to evaluate performance of the servo design in a specific system and performance of the servo over temperature variations.

In addition to characterizing servo performance, the Graphical User Interface (GUI) 204 may be used to adjust electro-optical system performance by updating values in the internal electro-optical system configuration database 214 from manually entered values via the host computer 202. Commands as well as data may be sent to the microcontroller 206 from the host computer 202. Examples of commands sent to the microcontroller 206 include setting a value on the bias DAC, setting a value on the modulation DAC, reading a parameter from the internal electro-optical system configuration database 214, and setting a parameter in the internal electro-optical system configuration database 214. Examples of parameters retrieved from the internal electro-optical system configuration database 214 for system performance are modulation DAC counts, bias DAC counts, temperature, measured peak power, measured average power, and analog to digital converter channel information.

A command may be sent via the Graphical User Interface (GUI) 204 to the microcontroller 206 to gather information, for example, to measure and calculate various parameters to obtain optimum calibrated performance of the electro-optical system. For example, the a command may be sent via the Graphical User Interface (GUI) 204 to the microcontroller 206 to increase an output of the electro-optical system such as bias current. The Graphical User Interface (GUI) 204 can then display the average optical power value to observe the result of the increase in bias current. A slope of the function of the bias DAC counts versus the monitor photodiode reading may be calculated from this information, for example, either in the program itself or using an external tool such as Microsoft excel. The calculated slope may then be stored in the internal electro-optical system configuration database 214 as the bias slope variable to modify the operation of the electro-optical system.

Figure 9:
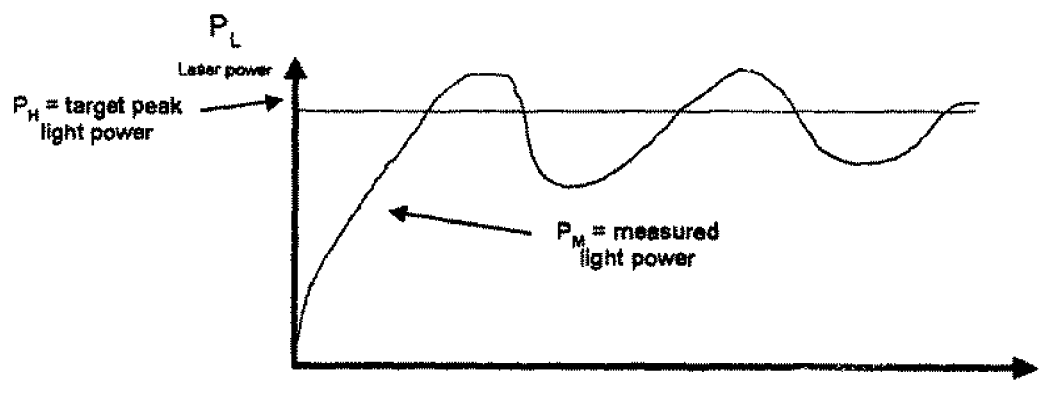
FIG. 9 illustrates a plot of under-damped measured optical output power $P_M$ in the forward servo control path of FIG. 8.
Figure 10:
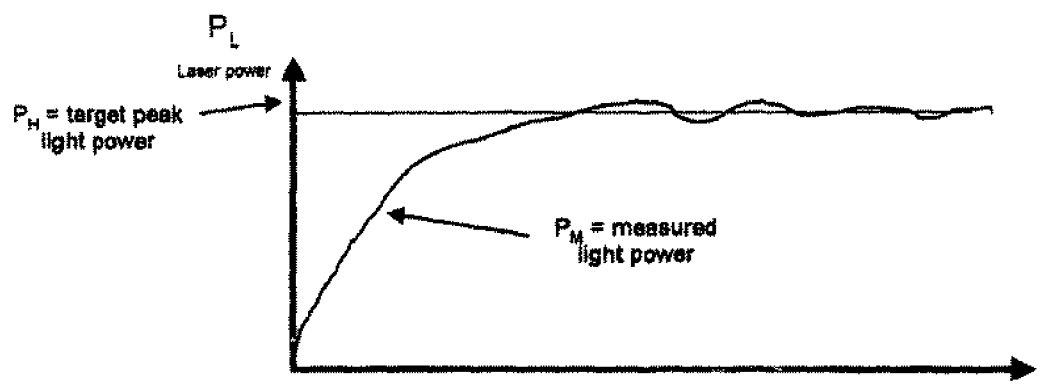
FIG. 10 illustrates a plot of critically damped measured optical output power $P_M$ in the forward servo control path of FIG. 8.
Figure 11:
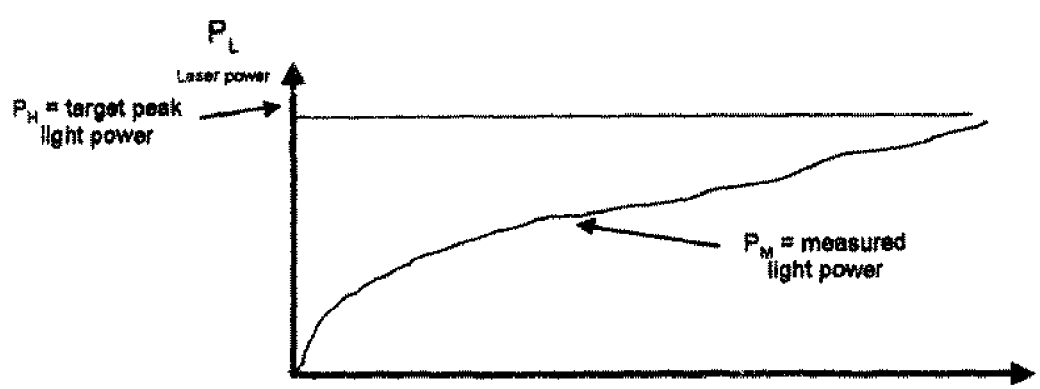
FIG. 11 illustrates a plot of over-damped measured optical output power $P_M$ in the forward servo control path of FIG. 8.

FIGS. 9-11 illustrate examples of evaluating servo performance of an electro-optical system such as a laser transceiver from information stored in the internal configuration database and plotted via the Graphical User Interface (204).

FIG. 9 illustrates a plot of under-damped measured optical power output $P_M$ in the forward servo control path 804 of FIG. 8. Shown in FIG. 9 are a laser optical power output $P_L$ axis 902, a time axis 904, a laser target peak optical power output $P_H$ 906, and a measured laser optical power output $P_M$ 908.

In FIG. 9, the measured optical power output $P_M$ 908 oscillates above and below the target peak optical power output $P_H$ 906.

FIG. 10 illustrates a plot of critically damped measured optical power output $P_M$ in the forward servo control path 804 of FIG. 8. Shown in FIG. 10 are a laser optical power output $P_L$ axis 902, a time axis 904, a laser target peak optical power output $P_H$ 906, and a measured laser optical power output $P_M$ 1002.

In FIG. 10, the measured laser optical power output $P_M$ 1002 does not reach the laser target peak optical power output $P_H$ 906 as quickly as in FIG. 9; however, the measured laser optical power output $P_M$ 1002 oscillates above and below the target peak optical power output $P_H$ 906 by a much smaller amount compared to the under-damped response of FIG. 9.

FIG. 11 illustrates a plot of over-damped measured optical power output $P_M$ in the forward servo control path 804 of FIG. 8. Shown in FIG. 10 are a laser optical power output $P_L$ axis 902, a time axis 904, a laser target peak optical power output $P_H$ 906, and a measured laser optical power output $P_M$ 1102.

In FIG. 11, the measured laser optical power output $P_M$ 1102 never overshoots the target peak optical power output $P_H$ 906; however, the measured laser optical power output $P_M$ 1102 does not reach the target peak optical power output $P_H$ 906 until a much longer time compared to FIG. 9 and FIG. 10.

The flow charts for the main program module and the application program modules described above may be embodied in a disk, a CD-ROM, and other computer readable media for loading and executing on a computer according to well-known computer programming techniques.

In addition to characterizing servo performance, commands may be sent to the microcontroller 206 via the Graphical User Interface (GUI) 204 and the host computer 202 to adjust the performance of the electro-optical system. For example, the Graphical User Interface (GUI) 204 may send commands to the microcontroller 206 to increase optical power output by increasing bias current or modulation current. In this manner, the host computer 202 can collect measurements and calculate parameter values to obtain optimum calibrated performance of the electro-optical system. The parameter values may then be used to update the values stored in the internal configuration database 214 to modify the operation of the electro-optical system.

In another embodiment, a method and firmware digitally control an electro-optical system by automatically setting and adjusting bias current and modulation current to maintain stable values of optical output power for a logic low state and a logic high state for modulating a laser with a data signal. The method and firmware perform steps of:

(a) receiving as input an operating temperature of the electro-optical system;
(b) calculating a value of threshold current for the electro-optical system as a function of the operating temperature;
(c) providing a logic low state bias current equal to the threshold current plus a bias margin current to the electro-optical system to produce an optical output power $P_{LOW}$ for a logic low state at the operating temperature; and
(d) automatically adjusting the logic low state bias current to maintain the optical output power of the electro-optical system for the logic low state at the optical output power $P_{LOW}$ as a function of the operating temperature when the operating temperature varies over time.

Figure 12:
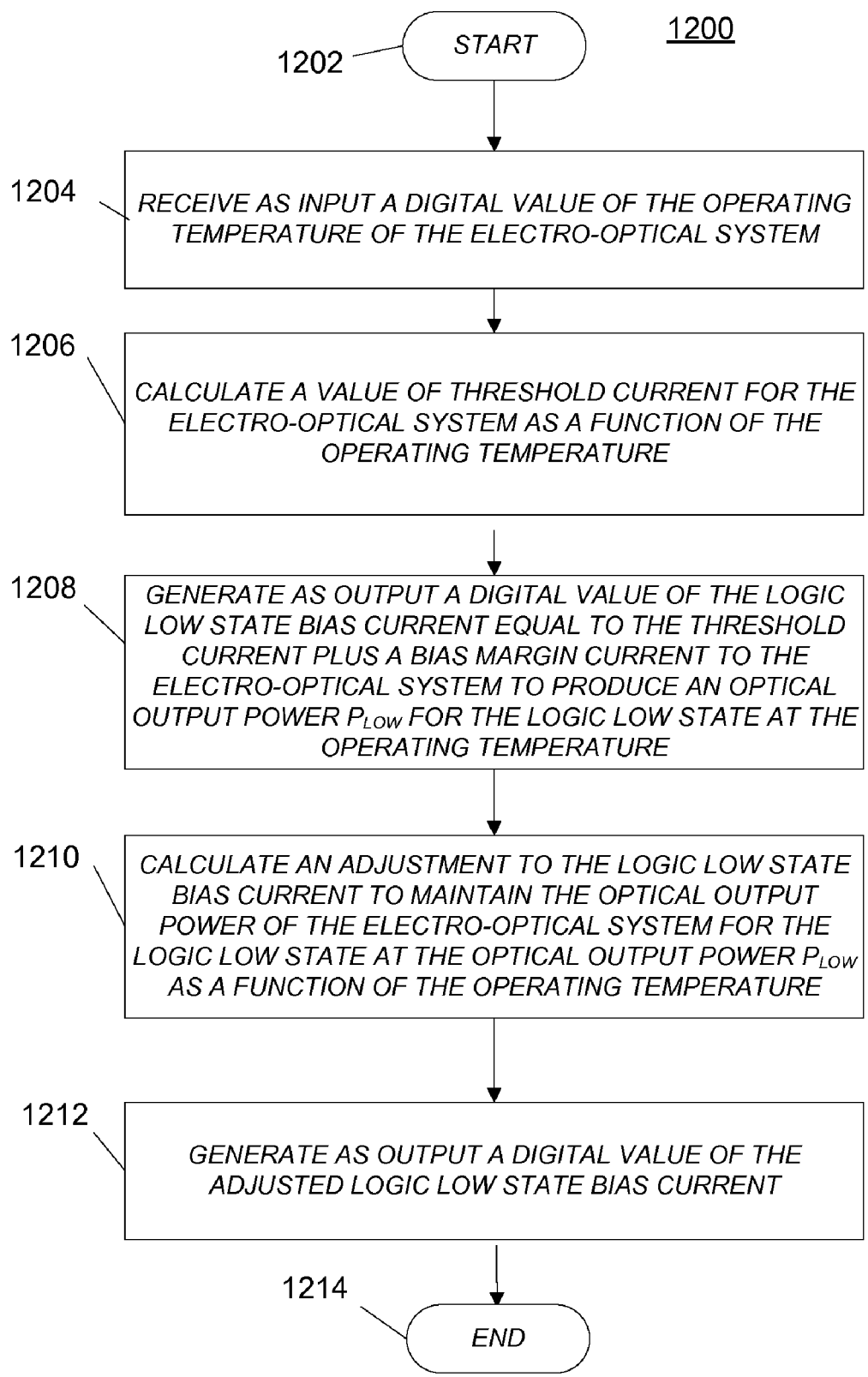
FIG. 12 illustrates a flow chart for an application program module for maintaining stable optical power output for a logic low state of an electro-optical system with the microcontroller of FIG. 2.

FIG. 12 illustrates a flow chart 1200 for an application program module for maintaining stable optical power output for a logic low state of an electro-optical system with the microcontroller 206 of FIG. 2.

Step 1202 is the entry point of the flow chart 1200.

In step 1204, the microcontroller 206 receives as input a digital value of the operating temperature of the electro-optical system, for example, from an analog-to-digital converter in the controller interface 208 connected to a temperature sensor in the laser 108.

In step 1206, the microcontroller 206 calculates a value of threshold current for the electro-optical system as a function of the operating temperature, for example, from the Find threshold application program module.

In step 1208, the microcontroller 206 generates as output a digital value of a logic low state bias current equal to the threshold current plus a bias margin current to the electro-optical system to produce an optical output power $P_{LOW}$ for the logic low state at the operating temperature. For example, the digital value of the bias margin current may set by the user via the GUI 204, or the digital value of the bias margin current may have a default value of twice the threshold current. In another embodiment, the digital value of the bias margin current may be fetched from the internal electro-optical system database 214 in the microcontroller 206. The digital value of a logic low state bias current is output to the controller interface 208. The controller interface converts the digital value to an analog signal and outputs the analog signal, for example, to the laser driver 112 to drive the laser 108.

In step 1210, the microcontroller 206 calculates an adjustment to the logic low state bias current to maintain the optical output power of the electro-optical system of the logic low state at the optical output power $P_{LOW}$ as a function of the operating temperature when the operating temperature varies over time, for example, from the Calculate bias margin current application program module. In other embodiments, values of the bias margin current for a range of temperatures may be stored in the electro-optical system configuration database 214. The microcontroller 206 may retrieve the value of the bias margin current for the corresponding temperature closest to the measured temperature of the electro-optical system 108 from the electro-optical system configuration database 214. Alternatively, the microcontroller 206 may retrieve the values of the bias margin current for the two corresponding temperatures closest to the measured temperature of the electro-optical system 108 from the electro-optical system configuration database 214 and interpolate between the two values of the bias margin current according to well-known interpolation techniques.

In step 1212, the microcontroller 206 generates as output a digital value for the adjusted logic low state bias current. The digital value is converted to a drive signal by the controller interface 208, and the drive signal is output from the controller interface 208, for example, to the laser driver 112. The adjusted value of the logic low state bias current for the measured temperature of the electro-optical device 108 may also be stored in the electro-optical system configuration database 214.

Step 1214 is the exit point of the flow chart 1200.

Figure 13:
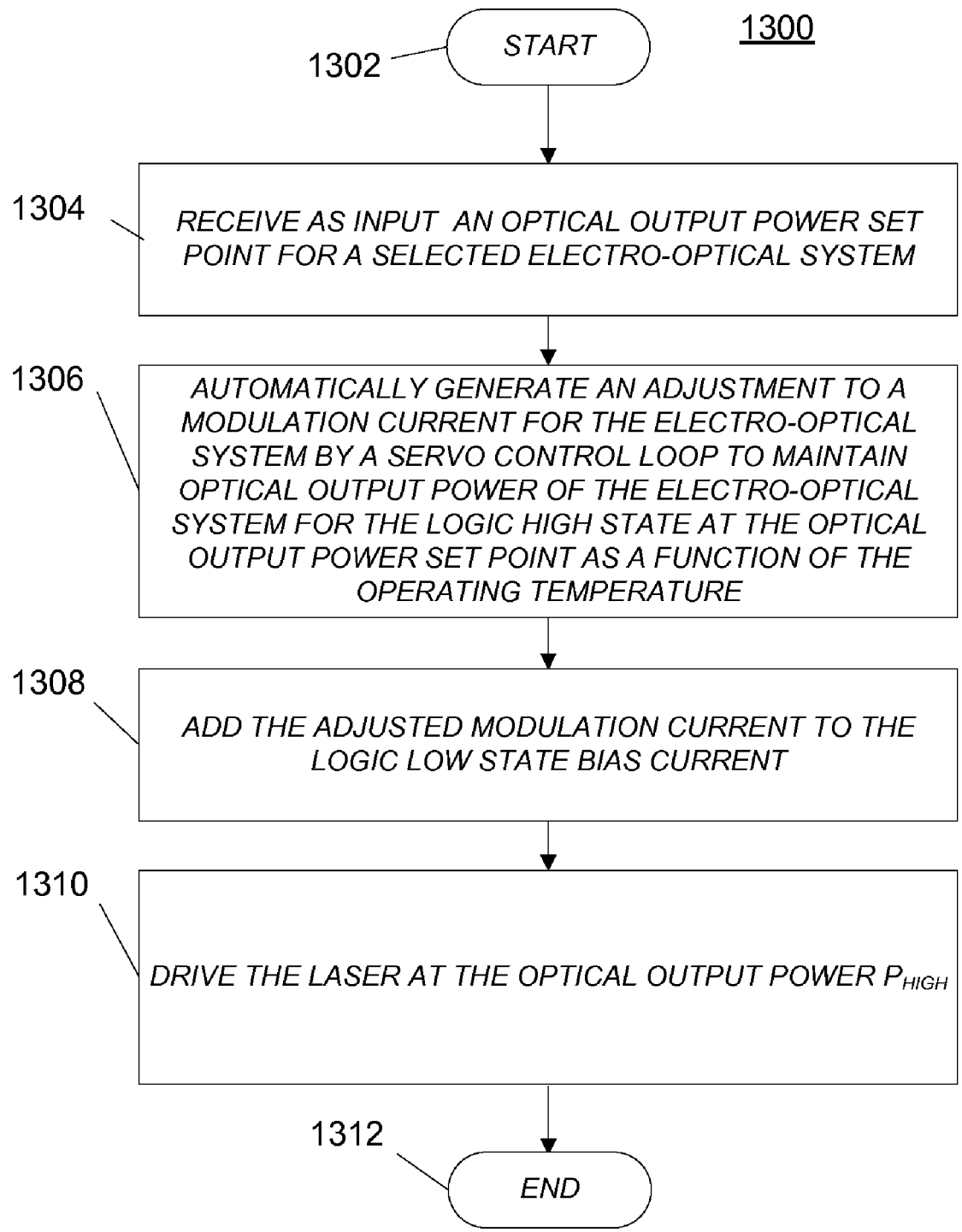
FIG. 13 illustrates a flow chart for an application program module for an application program module for maintaining stable optical power output for a logic high state of an electro-optical system according to the servo control loop of FIG. 8.

FIG. 13 illustrates a flow chart for an application program module for an application program module for maintaining stable optical power output for a logic high state of an electro-optical system according to the servo control loop of FIG. 8.

Step 1302 is the entry point of the flow chart 1300.

In step 1304, the microcontroller 206 receives as input an optical output power set point 836 for a selected electro-optical system. For example, the optical output power set point 836 may be entered by a user via the graphical user interface (GUI) of FIG. 2, or the optical output power set point may be fetched from the internal electro-optical system database 214 in the microcontroller 206.

In step 1306, the microcontroller 206 automatically generates an adjustment to a modulation current for the electro-optical system by a servo control loop to maintain optical output power of the electro-optical system for the logic high state at the optical output power set point as a function of the operating temperature when the operating temperature varies over time. For example, the adjustment may be calculated according to the pi process 842 that performs steps of subtracting the measured peak optical output power of the electro-optical system $P_{MPK}$ from the optical output power set point $P_{HIGH\_SET}$ to 836 generate the feedback error ERR, multiplying the feedback error ERR times the feedback constant a to generate a feedback product, adding the cumulative sum of the feedback error to the feedback product to generate a feedback sum, and multiplying the feedback sum by the loop gain constant $K_G$ to generate the adjustment to the modulation current.

In step 1308, the microcontroller 206 adds the adjusted modulation current to the logic low state bias current 860 by the summing amplifier 858.

In step 1310, the microcontroller 206 drives the laser 862 at the optical output power $P_{HIGH}$.

Step 1312 is the exit point of the flow chart 1300.

In another embodiment, a method of digital control for an electro-optical device is used to maintain stable optical output power of an electro-optical system. The method may be implemented in firmware to perform the following steps:

(a) receiving as input a first analog signal representative of a measured parameter from an electro-optical device generated by the electro-optical device in response to a second analog signal representative of a set parameter received by the electro-optical device;
(b) digitizing the first analog signal to generate a digital feedback value;
(c) subtracting the digital feedback value from a digital set point value to calculate a digital error value;
(d) calculating a digital cumulative error sum from the digital error value;
(e) calculating a digital control value as a function of the cumulative error sum;
(f) converting the digital control value to the second analog signal; and
(g) driving the electro-optical device toward the digital set point value with the second analog signal.

Figure 14:
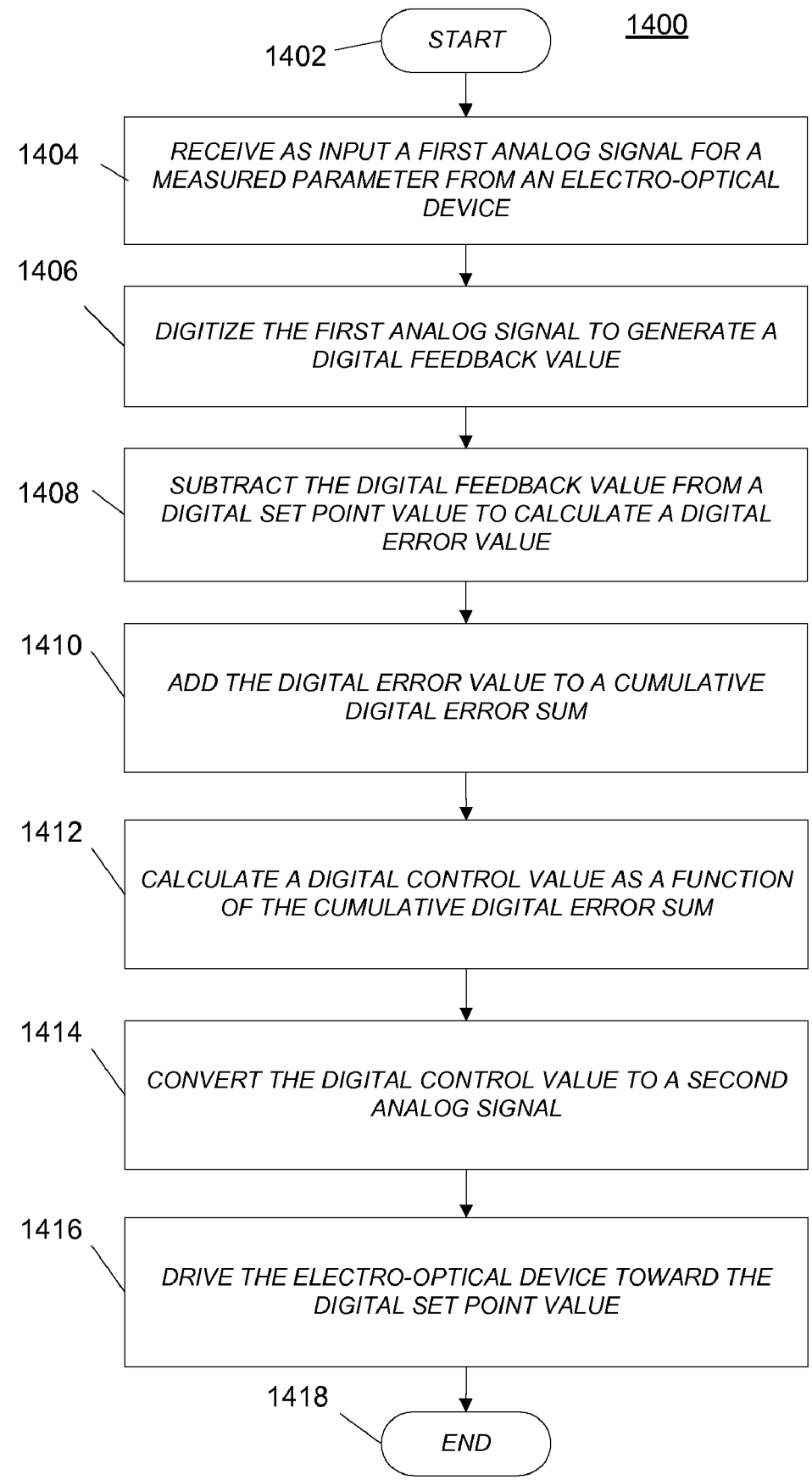
FIG. 14 illustrates a flow chart for a method of digitally controlling an electro-optical device.

FIG. 14 illustrates a flow chart for a method of digitally controlling an electro-optical device.

Step 1402 is the entry point of the flow chart 1400.

In step 1404, the microcontroller 206 receives as input a first analog signal representative of a measured parameter from an electro-optical device generated by the electro-optical device in response to a set parameter that is received by the electro-optical device. For example, measured parameter may be the output of the monitor photodiode 806 in FIG. 8. The set parameter may be, for example, the drive current from the digital-to-analog converter 848.

In step 1406, the microcontroller 206 digitizes the first analog signal to generate a digital feedback value, for example, by the analog-to-digital converter 822 and the average to peak conversion 834. For example, average to peak conversion 834 may double the digital feedback value.

In step 1408, the microcontroller 206 subtracts the digital feedback value from a digital set point value to calculate a digital error value. The digital set point value may be stored in the internal electro-optical device configuration database, or the digital set point value may be entered by a user via the Graphical User Interface (GUI). The digital set point value is representative of an optical modulation, for example, for a logic low state or a logic high state.

In step 1410, the microcontroller 206 adds the digital error value to a cumulative digital error sum that includes the sum of the previous digital error values.

In step 1412, the microcontroller 206 calculates a digital control value as a function of the set parameter from the cumulative digital error sum. The function of the set parameter may be, for example, the modulation characteristic GL 612 in FIG. 6.

In step 1414, the microcontroller 206 converts the digital control value to the second analog signal. For example, if the digital set point value is an optical power set point, the microcontroller 206 sets a count in the modulation current digital-to-analog converter 848 that corresponds to the digital control value.

In step 1416, the microcontroller 206 drives the electro-optical device 108 toward the desired digital set point value by the second analog signal, for example, via the controller 208 in FIG. 2.

Step 1418 is the exit point of the flow chart 1400.

By automating the adjustments to the bias current and the modulation current to maintain a desired set point value for each with separate digital servo control loops as described with reference to FIG. 14, various functions such as calibration may be performed for lasers and other electro-optical systems without distracting the user with the task of maintaining stable values of optical output power for $P_{LOW}$ and $P_{HIGH}$.

Digital Servo Control for CCFLs

In one embodiment, a method and firmware for digital servo control of an electro-optical device maintains stable optical output power for a cold cathode fluorescent lamp (CCFL) and includes steps of:
receiving a value of an optical current set point of a cold cathode fluorescent lamp;
subtracting a measured peak optical current of the cold cathode fluorescent lamp from the optical output current set point to generate a feedback error;
multiplying the feedback error times a feedback constant to generate a feedback product;
adding a cumulative sum of the feedback error to the feedback product to generate a feedback sum;
and multiplying the feedback sum by a loop gain constant to generate an adjustment to a drive current for the cold cathode fluorescent lamp.

Digital Servo Control for LEDs

In one embodiment, a method and firmware for digital servo control of an electro-optical device maintains stable optical power for a light emitting diode (LED) and includes steps of:
receiving a value of an optical power set point of a light emitting diode;
subtracting a measured peak optical output power of the light emitting diode from the optical output power set point to generate a feedback error;
multiplying the feedback error times a feedback constant to generate a feedback product;
adding a cumulative sum of the feedback error to the feedback product to generate a feedback sum;
and multiplying the feedback sum by a loop gain constant to generate an adjustment to a drive current for the light emitting diode.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method, comprising:
   receiving, by an electro-optical system, a first analog signal representative of a measured parameter from an electro-optical device of the electro-optical system, wherein the first analog signal is generated by the electro-optical device in response to receipt, by the electro-optical device, of a second analog signal representative of a set parameter;
   digitizing, by the electro-optical system, the first analog signal to generate a digital feedback value;
   subtracting, by the electro-optical system, the digital feedback value from a digital set point value to determine a digital error value;
   determining, by the electro-optical system, a digital cumulative error sum from the digital error value;
   determining, by the electro-optical system, a digital control value as a function of the cumulative error sum;
   converting, by the electro-optical system, the digital control value to a third analog signal; and
   driving, by the electro-optical system, the electro-optical device with the third analog signal, wherein the third analog signal is configured to compensate for the digital error value.

2. The method of claim 1, wherein said receiving comprises receiving, by the electro-optical system, the first analog signal as an optical power signal.

3. The method of claim 1, wherein determining the digital control value comprises determining, by the electro-optical system, the digital control value for drive current.

4. The method of claim 3, wherein said subtracting comprises subtracting, by the electro-optical system, the digital feedback value from a digital set point value representative of an optical modulation amplitude.

5. The method of claim 3, wherein said subtracting comprises subtracting, by the electro-optical system, the digital feedback value from a digital set point value representative of an average of an optical modulation for a logic low state and an optical modulation for a logic high state.

6. The method of claim 1, wherein said receiving comprises receiving, by the electro-optical system, the first analog signal as a feedback signal from the electro-optical device.

7. The method of claim 1, wherein said receiving comprises receiving, by the electro-optical system, the first analog signal from an electro-optical device comprising one of a laser, a cold-cathode fluorescent lamp, a laser diode, and a light-emitting diode.

8. The method of claim 1, wherein said determining the digital control value comprises determining, by the electro-optical system, the digital control value as a function of a first gain constant, resulting from converting the first analog signal to the digital feedback value, and a second gain constant, resulting from converting the digital control signal to the second analog signal.

9. The method of claim 1, wherein said determining the digital control value comprises determining, by the electro-optical system, the digital control value as a sum of the digital cumulative error sum and a product of the digital error value multiplied by a loop gain constant.

10. The method of claim 1, further comprising determining, by the electro-optical system, a threshold current, wherein said determining the threshold current comprises:
   recording a corresponding value of optical output power for a number of selected values of bias current, wherein said recording generates a series of data points associated with a transfer function of the electro-optical system;
   determining a first line associated with the transfer function and a second line associated with the transfer function based on the series of data points;
   determining, by the electro-optical system, an intersection point of the first line and the second line; and
   generating, by the electro-optical system, an output value of threshold current based on the intersection point.

11. The method of claim 1, wherein determining the digital control value further comprises determining, by the electro-optical system, an adjustment to a bias margin current as a function of a slope efficiency of the electro-optical system.

12. The method of claim 1, wherein determining the digital control value further comprises calculating an adjustment to a bias margin current in floating point arithmetic.

13. A tangible computer readable storage medium having instructions stored thereon, that if executed by an electro-optical system, cause the electro-optical system to perform operations comprising:
   receiving an operating temperature of the electro-optical system;
   determining a value of threshold current for the electro-optical system based on the operating temperature;
   generating a logic low state bias current based on the threshold current plus a bias margin current, wherein the logic low state bias current is configured to produce a determined optical output power for a logic low state at the operating temperature; and
   adjusting the logic low state bias current to maintain the determined optical output power for the logic low state in response to receipt of a second operating temperature of the electro-optical system.

14. The tangible computer readable storage medium of claim 13, wherein the instructions, if executed by the electro-optical system, cause the electro-optical system to perform operations further comprising:
   receiving an optical output power set point for a logic high state for the electro-optical system; and
   generating an adjustment to a modulation current to maintain optical output power for the logic high state based on receiving the second operating temperature of the electro-optical system.

15. The tangible computer readable storage medium of claim 14, wherein the instructions, if executed by the electro-optical system, cause the electro-optical system to perform operations further comprising:
   subtracting a measured peak optical output power of the electro-optical system from the optical output power set point for the logic high state to generate a feedback error;
   multiplying the feedback error times a feedback constant to generate a feedback product;
   adding a cumulative sum of the feedback error to the feedback product to generate a feedback sum; and
   multiplying the feedback sum by a loop gain constant to generate the adjustment to the modulation current.

16. The tangible computer readable storage medium of claim 14, wherein the instructions, if executed by the electro-optical system, cause the electro-optical system to perform operations further comprising:

calculating the adjustment to the modulation current in floating point arithmetic.

17. The tangible computer readable storage medium of claim 13, wherein determining the value of threshold current for the electro-optical system further comprises:

recording a corresponding value of optical output power for a number of selected values of bias current to generate a series of data points associated with a transfer function of the electro-optical system;

determining a first line associated the transfer function and a second line associated with the transfer function based on the series of data points;

determining an intersection point of the first line and the second line; and generating as output the value of threshold current based on the intersection point.

18. The tangible computer readable storage medium of claim 13, wherein the instructions, if executed by the electro-optical system, cause the electro-optical system to perform operations further comprising:

calculating the adjustment to the bias margin current as a function of a slope efficiency of the electro-optical system.

19. The tangible computer readable storage medium of claim 13, wherein the instructions, if executed by the electro-optical system, cause the electro-optical system to perform operations further comprising:

calculating the adjustment to the bias margin current in floating point arithmetic.

20. A method, comprising:

receiving, by a processing unit, a value of an optical output power set point for a laser;

subtracting, by the processing unit, a measured peak optical output power of the laser from the optical output power set point to generate a feedback error;

multiplying, by the processing unit, the feedback error by a feedback constant to generate a feedback product;

adding, by the processing unit, a cumulative sum of the feedback error to the feedback product to generate a feedback sum; and multiplying, by the processing unit, the feedback sum by a loop gain constant to generate an adjustment to a laser modulation current.

21. A method, comprising:

setting, by a processing unit, a zero bias value and a zero modulation value for a laser corresponding to a zero optical power point of the laser;

receiving, by the processing unit, a photodiode response value for the zero optical output power point of the laser and storing the photodiode response value as an initial photodiode current;

receiving, by the processing unit, a temperature sensor response value for the zero optical output power point and storing the temperature sensor response value as an initial temperature;

generating, by the processing unit, a selected number of values of bias current and recording a corresponding optical output power for the selected number of values of bias current to generate a series of data points, wherein the series of data points are associated with a laser transfer function;

determining, by the processing unit, a first line of the laser transfer function and a second line of the transfer function;

determining, by the processing unit, a value of laser threshold current and a value of laser threshold optical power based on an intersection point of the first line and the second line; and storing, by the processing unit, the value of laser threshold current and the value of laser threshold optical power based on the determination.

22. The method of claim 21, wherein determining, by the processing unit, the value of laser threshold current and the value of the laser threshold optical power is based on receiving of triggering event.

23. The method of claim 22, wherein determining, by the processing unit, the value of the laser threshold current and the value of the laser threshold optical power is based on detecting a change in the temperature sensor response value.

24. The method of claim 21, further comprising:

generating, by the processing unit, a laser slope efficiency based on the slope of the second line.

25. A tangible computer readable storage medium having instructions stored thereon, that if executed by an electro-optical system, cause the electro-optical system to perform operations comprising:

receiving a first analog signal representative of a measured parameter from an electro-optical device of the electro-optical system, wherein the first analog signal is generated by the electro-optical device in response to receipt of a second analog signal representative of a set parameter;

digitizing the first analog signal to generate a digital feedback value;

subtracting the digital feedback value from a digital set point value to determine a digital error value;

determining a digital cumulative error sum from the digital error value;

determining a digital control value as a function of the cumulative error sum;

converting the digital control value to a third analog signal; and driving the electro-optical device with the third analog signal, wherein the third analog signal is configured to compensate for the digital error value.

26. The tangible computer readable storage medium of claim 25, wherein the first analog signal is an optical power signal.

27. The tangible computer readable storage medium of claim 25, wherein determining the digital control value comprises determining the digital control value for drive current.

28. The tangible computer readable storage medium of claim 27, wherein the digital set point value represents an optical modulation amplitude.

29. The tangible computer readable storage medium of claim 27, wherein the digital set point value represents an average of an optical modulation for a logic low state and an optical modulation for a logic high state.

30. The tangible computer readable storage medium of claim 25, wherein the first analog signal is a feedback signal from the electro-optical device.

31. The tangible computer readable storage medium of claim 25, the electro-optical device comprises one of a laser, a cold-cathode fluorescent lamp, a laser diode, and a light-emitting diode.

32. The tangible computer readable storage medium of claim 25, wherein determining the digital control value comprises determining the digital control value as a function of a first gain constant, resulting from converting the first analog signal to the digital feedback value and a second gain constant, resulting from converting the digital control signal to the second analog signal.

33. The tangible computer readable storage medium of claim 25, wherein determining the digital control value comprises determining the digital control value as a sum of the cumulative error sum and a product of the digital error value multiplied by a loop gain constant.

34. A tangible computer readable storage medium having instructions stored thereon, that if executed by an electro-optical system, cause the electro-optical system to perform operations comprising:
receiving a digital value of an operating temperature and a digital set point value of the electro-optical system;
determining a value of threshold current based on the operating temperature;
generating a total bias current equal to a sum of the threshold current and an average bias current to produce an average optical output power; and
generating as output a modulation current configured to drive the electro-optical system to the digital set point value.

35. A tangible computer readable storage medium having instructions stored thereon, that if executed by an electro-optical system, cause the electro-optical system to perform operations comprising:
measuring an operating temperature of the electro-optical system; and
determining a value for total bias current from a function of the operating temperature, the function including a polynomial temperature coefficient.

36. The tangible computer readable storage medium of claim 35, further comprising: determining a laser threshold current IT at a temperature T2 from the function $$IT(T2)=IT0+IT1(T2-T0)+IT2(T2-T0)^2$$

where IT0, IT1, and IT2 are polynomial temperature coefficients that are determined during calibration of the electro-optical system at a calibration temperature T0.

37. A tangible computer readable storage medium having instructions stored thereon, that if executed by an electro-optical system, cause the electro-optical system to perform operations comprising:
measuring an operating temperature of the electro-optical system; and
determining a modulation current from a function of the operating temperature, the function including a polynomial temperature coefficient.

38. The tangible computer readable storage medium of claim 37, further comprising: determining a modulation slope GL at a temperature T2 from a temperature model according to $$GL(T2)=GL0+GL1(T2-T0)+GL2(T2-T0)^2$$

where GL0, GL1, and GL2 are polynomial temperature coefficients that are determined during calibration of the electro-optical system at a calibration temperature T0.

* * * * *

UNITED STATES PATENT AND TRADEMARK OFFICE
CERTIFICATE OF CORRECTION

PATENT NO. : 7,850,083 B2
APPLICATION NO. : 11/537504
DATED : December 14, 2010
INVENTOR(S) : Sanchez-Olea et al.

It is certified that error appears in the above-identified patent and that said Letters Patent is hereby corrected as shown below:

Title Page, item (63), under "Related U.S. Application Data", in Column 1, Lines 1-4, delete "Continuation-in-part of application No. 11/397,651, filed on Apr. 4, 2006, now Pat. No. 7,185,815, and a continuation-in-part of application No. 10/512,931, filed on Oct. 29, 2004, now Pat. No. 7,154,924," and insert -- Continuation-in-part of application No. 10/512,931, filed on Oct. 29, 2004, now Pat. No. 7,154,924, and a continuation-in-part of application No. 11/397,651, filed on Apr. 4, 2006, now Pat. No. 7,185,815, --.

Column 1, lines 20-21, delete "6,629,6388B1" and insert -- 6,629,638 B1 --.

Column 1, line 21, delete "Nov" and insert -- Nov. --.

Column 6, line 24, delete "microcontroller 202" and insert -- microcontroller 206 --.

Column 7, line 49, delete "12C" and insert -- I2C --.

Column 9, line 4, delete "library 306." and insert -- library 212. --.

Column 14, line 67, delete "$G_L\cdot=G_{TF}$" and insert -- $G_L=G_{TF}$ --.

Column 23, line 12, in Claim 17, after "associated" delete "the" and insert -- with the --.

Signed and Sealed this
Twenty-sixth Day of April, 2011

David J. Kappos
*Director of the United States Patent and Trademark Office*